(12) United States Patent
Rostami

(10) Patent No.: US 9,742,885 B2
(45) Date of Patent: Aug. 22, 2017

(54) ELECTRONIC DEVICE ATTACHMENT WITH ELECTRICAL ENERGY STORAGE

(71) Applicant: Ramin Rostami, Calabasas, CA (US)

(72) Inventor: Ramin Rostami, Calabasas, CA (US)

(73) Assignee: Advanced Wireless Innovations LLC, Sant Monica, CA (US)

( * ) Notice: Subject to any disclaimer, the term of this patent is extended or adjusted under 35 U.S.C. 154(b) by 0 days.

(21) Appl. No.: 15/303,090

(22) PCT Filed: Apr. 1, 2015

(86) PCT No.: PCT/US2015/023853
§ 371 (c)(1),
(2) Date: Oct. 10, 2016

(87) PCT Pub. No.: WO2015/157062
PCT Pub. Date: Oct. 15, 2015

(65) Prior Publication Data
US 2017/0041443 A1    Feb. 9, 2017

Related U.S. Application Data

(63) Continuation of application No. PCT/US2014/051961, filed on Aug. 20, 2014.
(Continued)

(51) Int. Cl.
| | | |
|---|---|---|
| *H04B 1/38* | (2015.01) |
| *H04M 1/02* | (2006.01) |
| *H02J 7/02* | (2016.01) |
| *H02J 50/10* | (2016.01) |
| *H04B 1/3883* | (2015.01) |
| *H04B 1/3888* | (2015.01) |

(Continued)

(52) U.S. Cl.
CPC .......... *H04M 1/0262* (2013.01); *H02J 7/025* (2013.01); *H02J 50/10* (2016.02); *H04B 1/3883* (2013.01); *H04B 1/3888* (2013.01); *H04M 1/72575* (2013.01); *H05K 5/0017* (2013.01); *H05K 5/0086* (2013.01); *H05K 5/026* (2013.01); *H05K 7/14* (2013.01); *H02J 7/0044* (2013.01); *H04M 1/185* (2013.01); *H04M 1/72527* (2013.01); *H04M 2001/0204* (2013.01)

(58) Field of Classification Search
CPC .......... H04M 1/72575; H04M 1/0262; H04M 1/185; H04M 1/72527; H04M 2001/0204; H02J 50/10; H02J 7/0044; H02J 7/025; H02J 17/00; H04B 1/3883; H04B 1/3888; H05K 5/0017; H05K 5/0086; H05K 5/026

See application file for complete search history.

(56) References Cited

U.S. PATENT DOCUMENTS

| | | |
|---|---|---|
| 6,184,654 B1 | 2/2001 | Bachner, III et al. |
| 2009/0102416 A1 | 4/2009 | Burley |

(Continued)

*Primary Examiner* — Xin Jia
(74) *Attorney, Agent, or Firm* — Mintz Levin Cohn Ferris Glovsky and Popeo, P.C.

(57) ABSTRACT

A system, topology, and methods including apparatus for releasably secure attachment to an electronic device. The apparatus or a component of the apparatus may include an electrical energy storage element. The apparatus or a compound of apparatus may be slidably coupled to an electronic device. The apparatus or a component of apparatus may be slidably coupled to an electronic device via a side, top, or base and rear of the electronic device. Other embodiments may be described and claimed.

20 Claims, 33 Drawing Sheets

Related U.S. Application Data

(60) Provisional application No. 62/100,885, filed on Jan. 7, 2015, provisional application No. 62/109,491, filed on Jan. 29, 2015, provisional application No. 62/111,950, filed on Feb. 4, 2015, provisional application No. 61/978,188, filed on Apr. 10, 2014.

(51) Int. Cl.
| | | |
|---|---|---|
| *H05K 5/00* | (2006.01) | |
| *H05K 5/02* | (2006.01) | |
| *H05K 7/14* | (2006.01) | |
| H04M 1/18 | (2006.01) | |
| H04M 1/725 | (2006.01) | |
| H02J 7/00 | (2006.01) | |

(56) References Cited

U.S. PATENT DOCUMENTS

| | | |
|---|---|---|
| 2010/0124040 A1 | 5/2010 | Diebel et al. |
| 2012/0306431 A1 | 12/2012 | Li et al. |
| 2012/0329532 A1 | 12/2012 | Ko |
| 2013/0313252 A1 | 11/2013 | Chan |
| 2014/0035511 A1 | 2/2014 | Ferber et al. |
| 2014/0091689 A1 | 4/2014 | Mishan et al. |

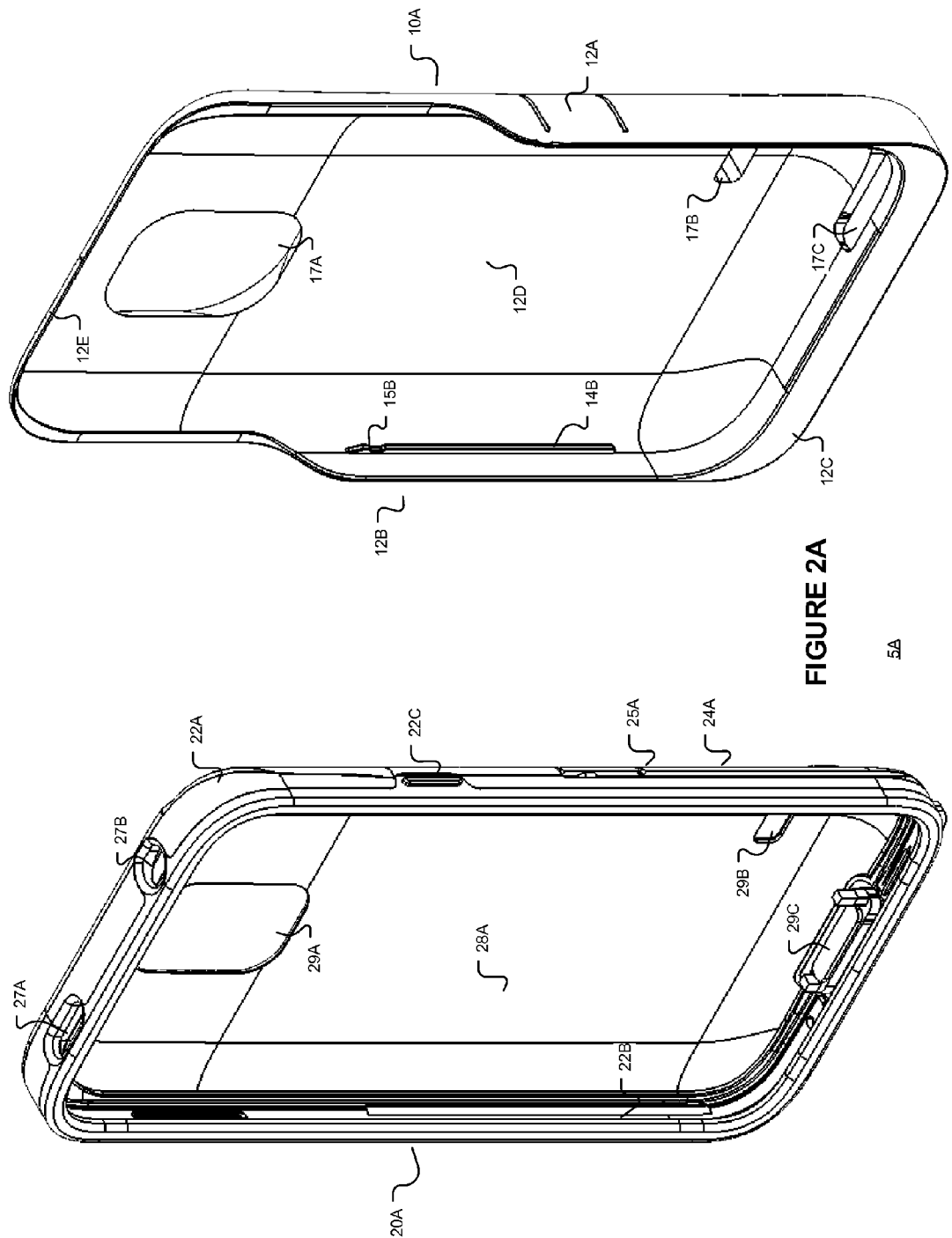

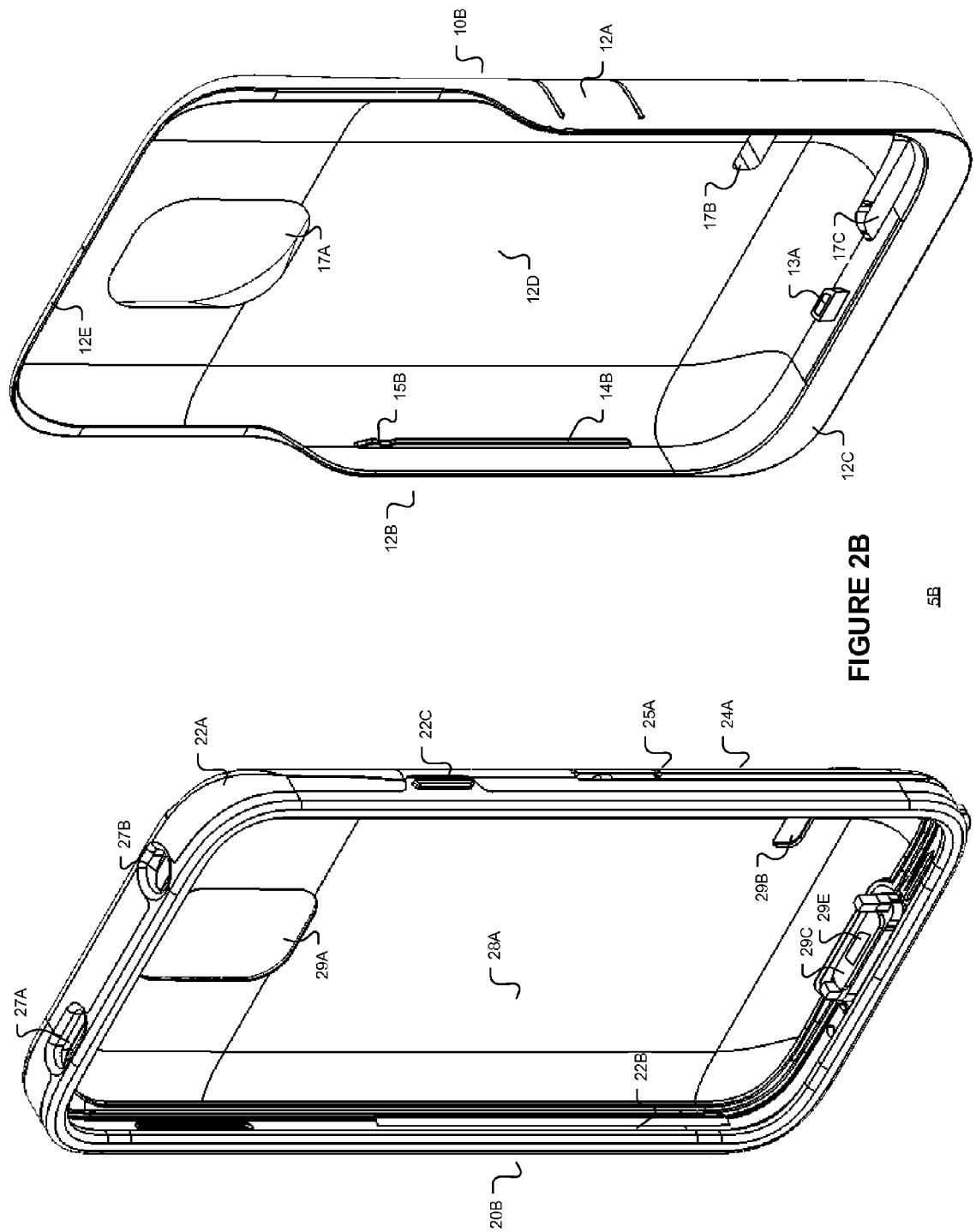

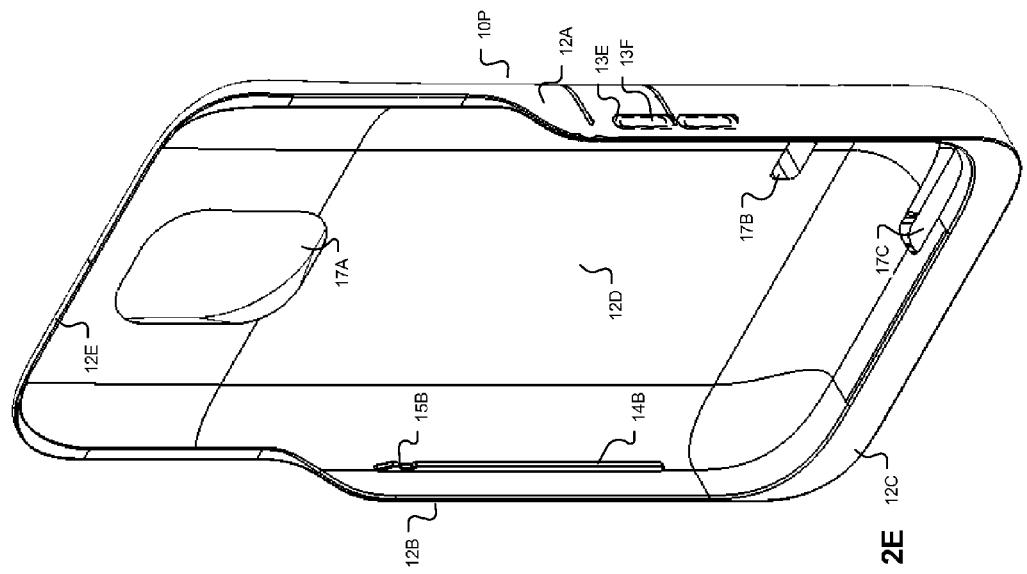
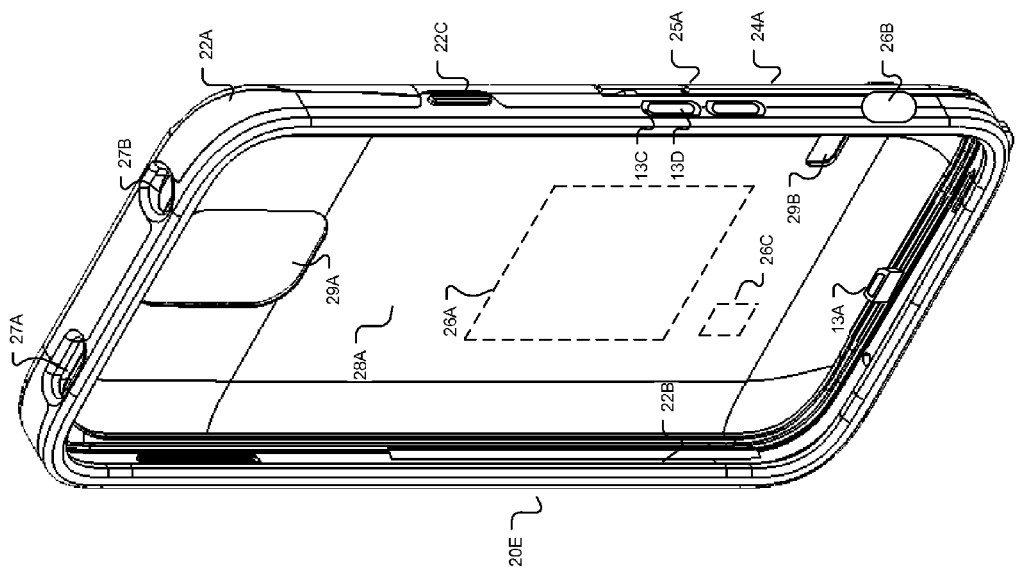
FIGURE 2E

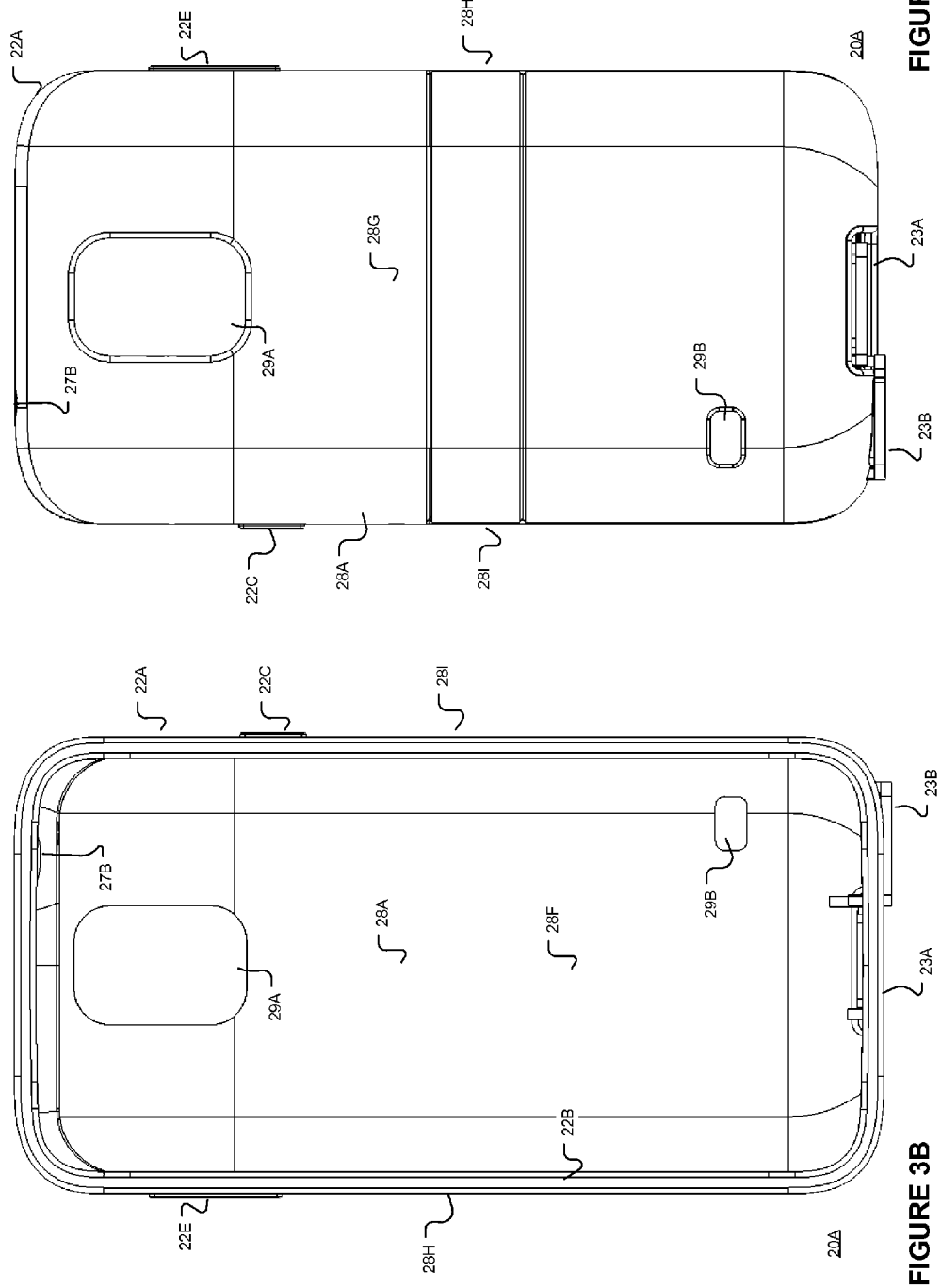

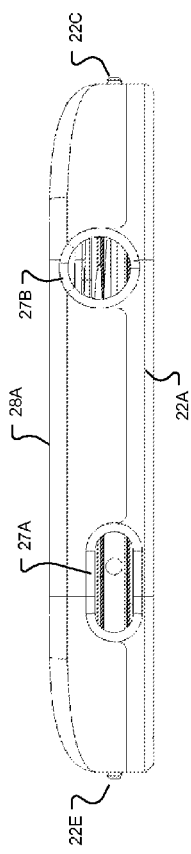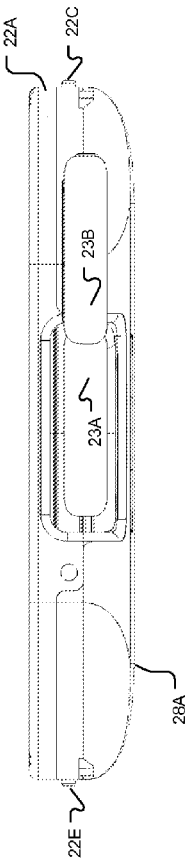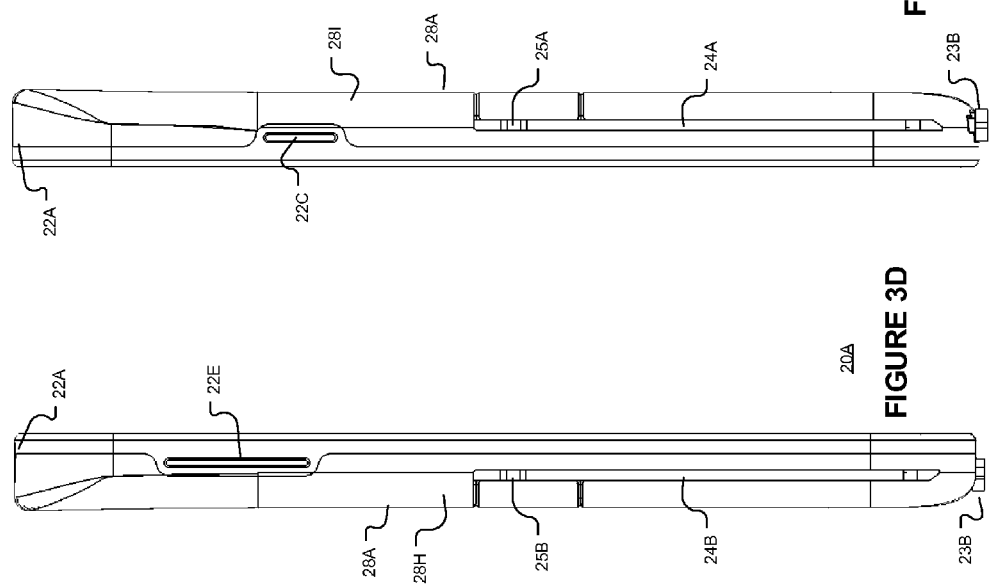

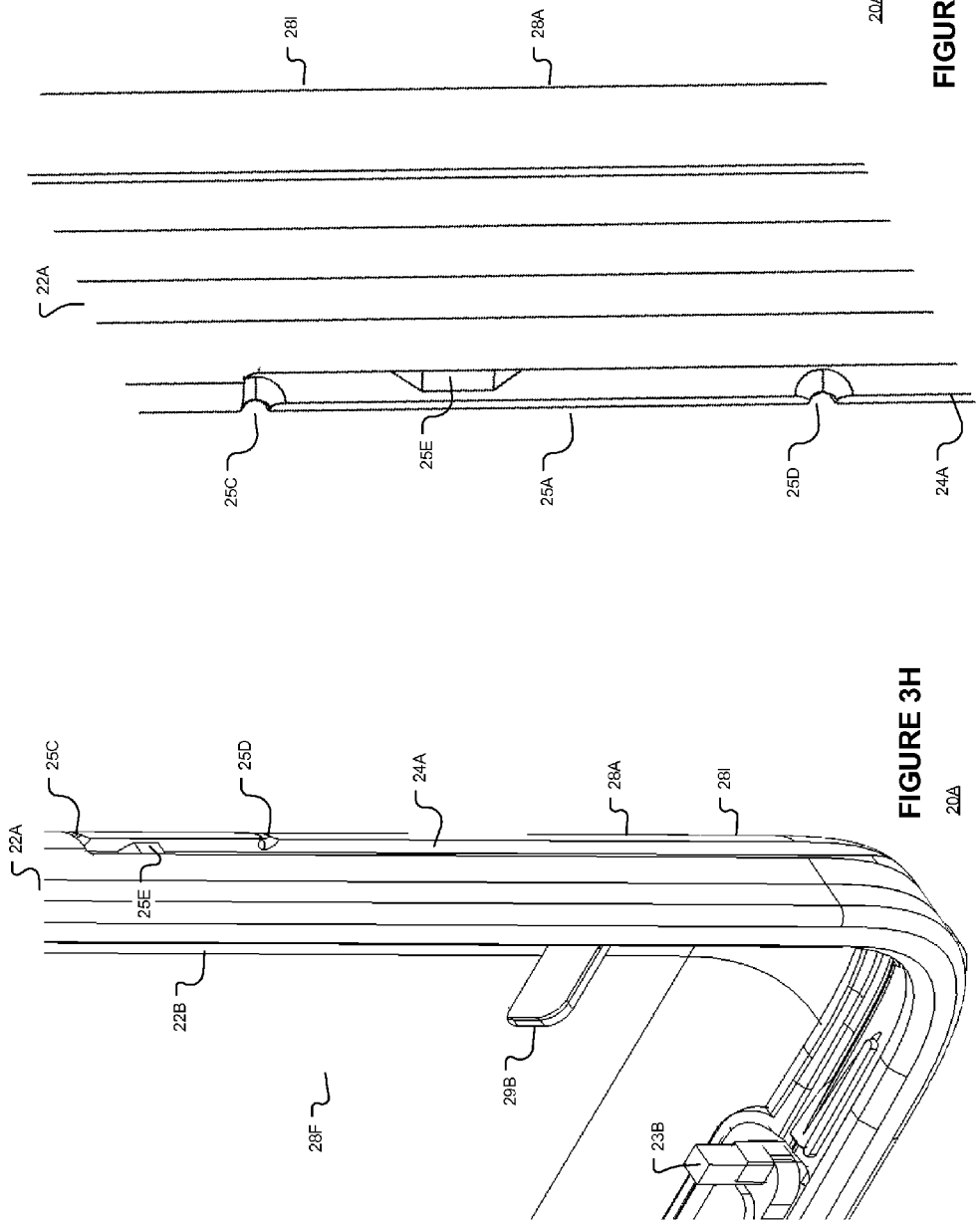

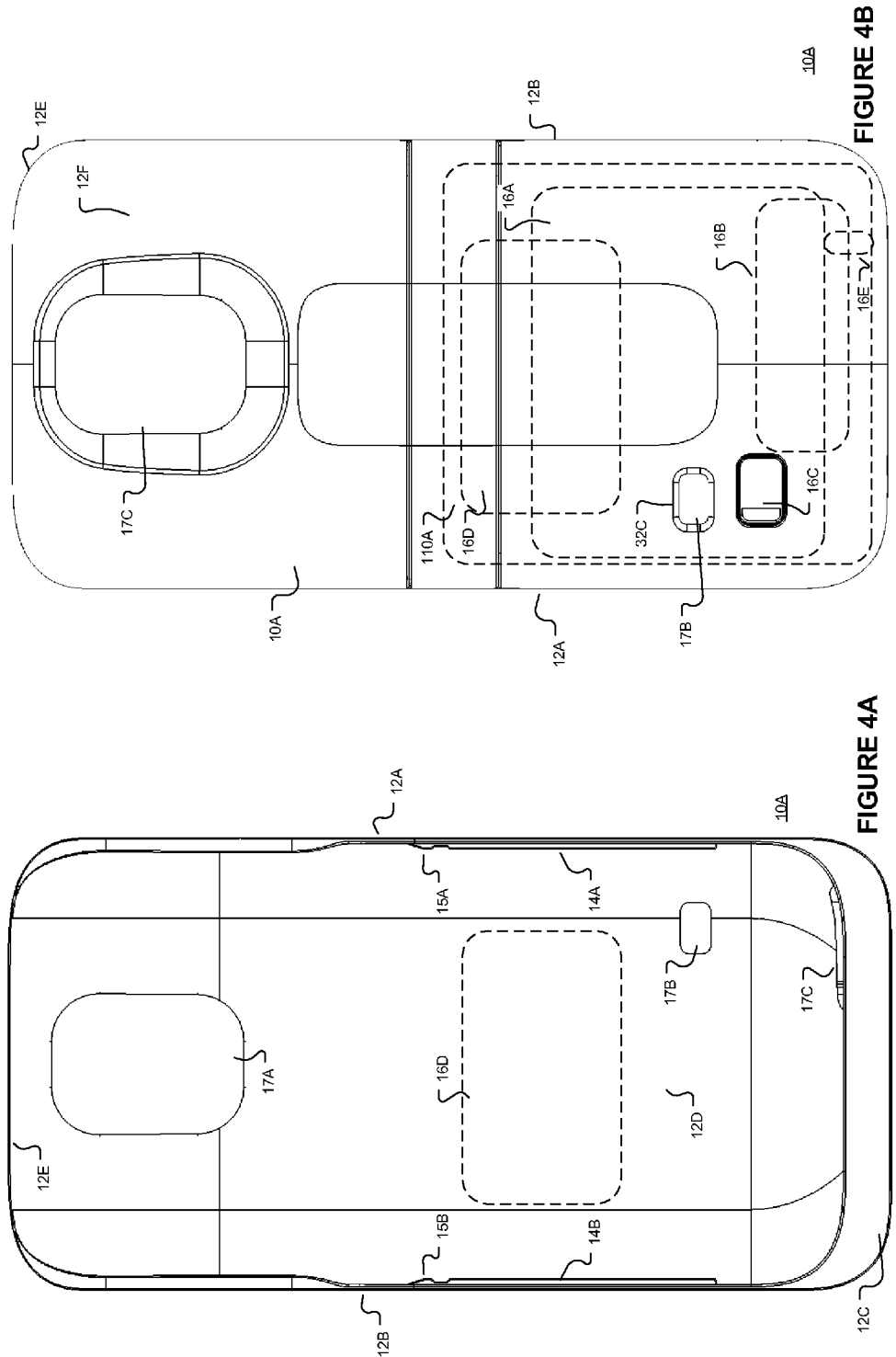

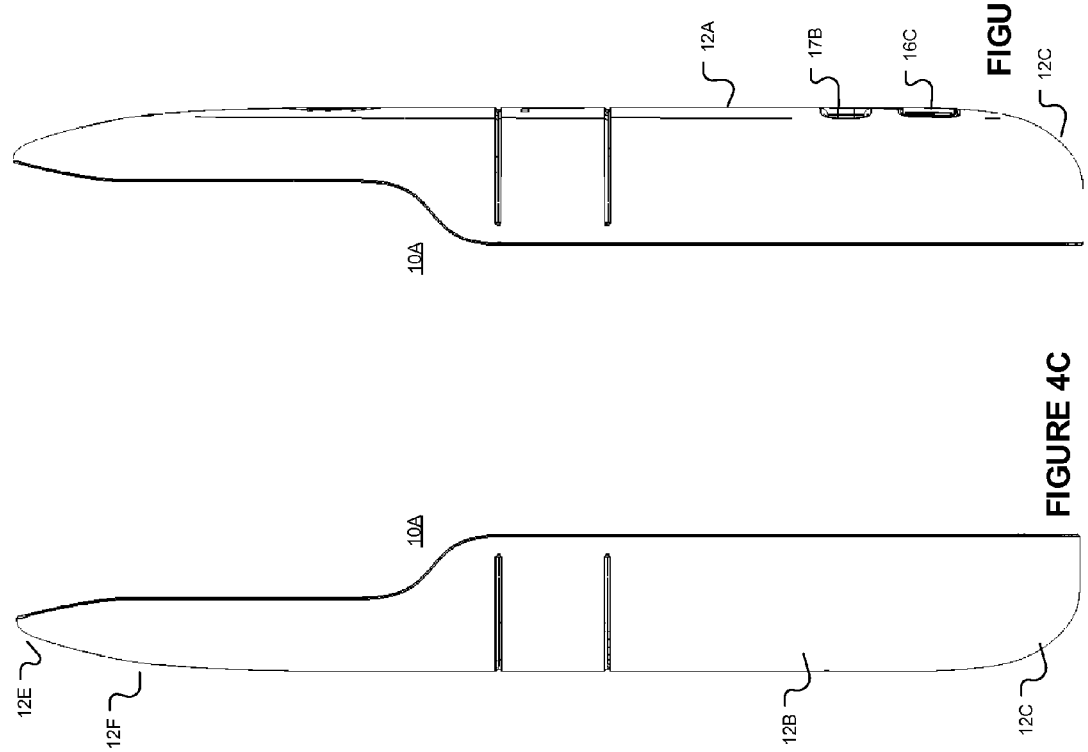

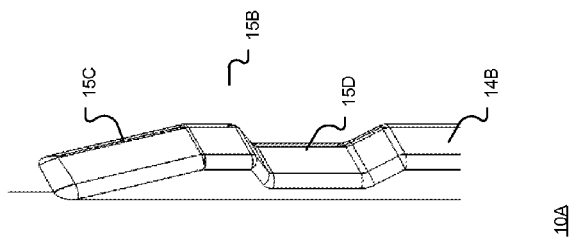
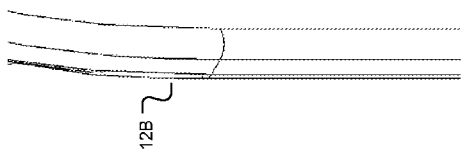
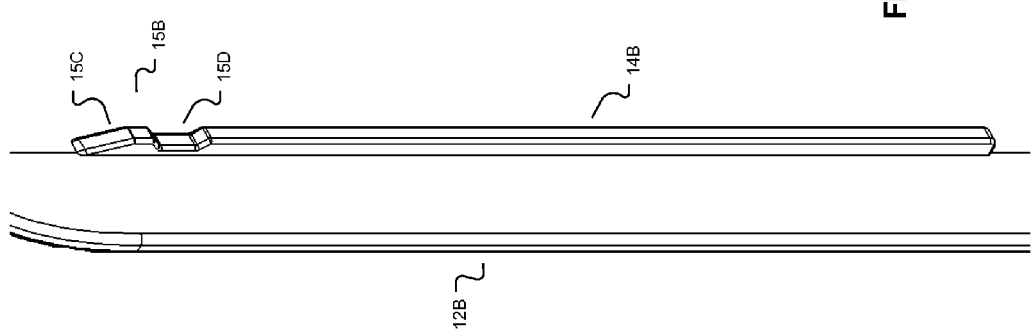
FIGURE 4H
FIGURE 4G

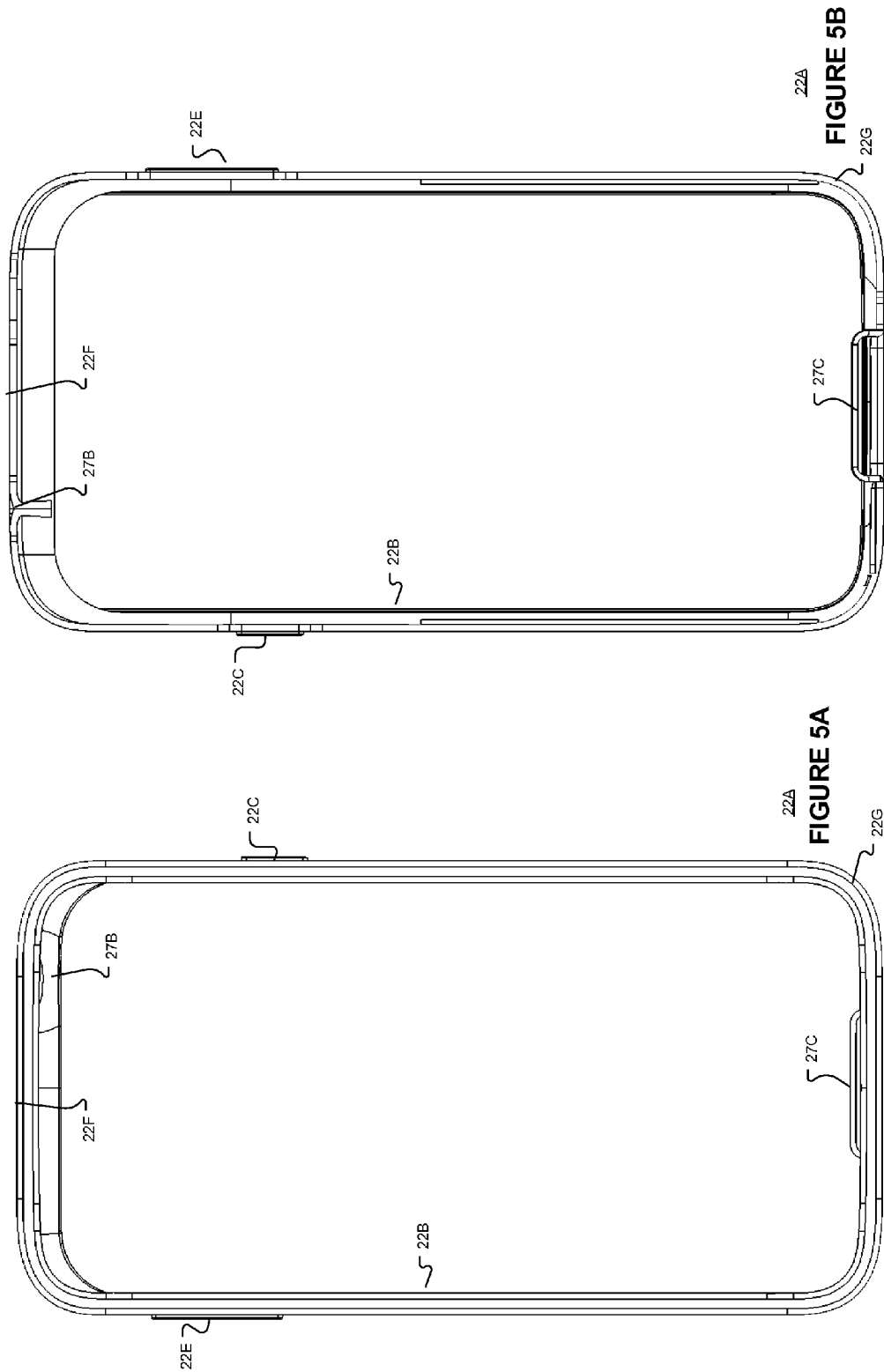

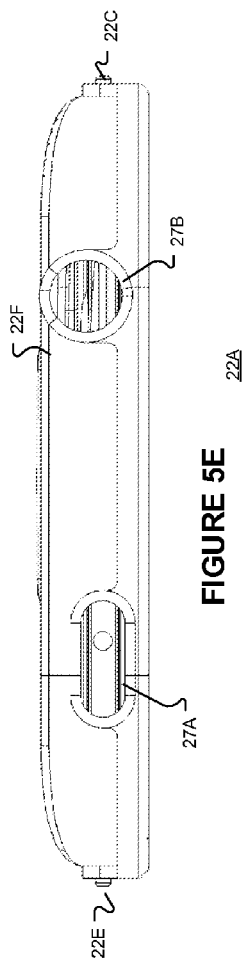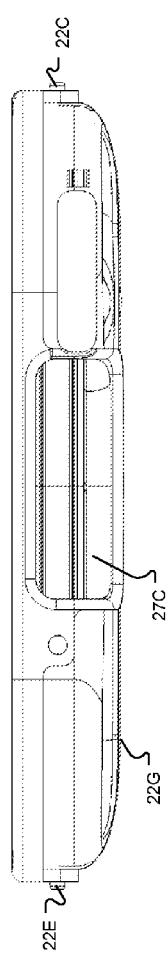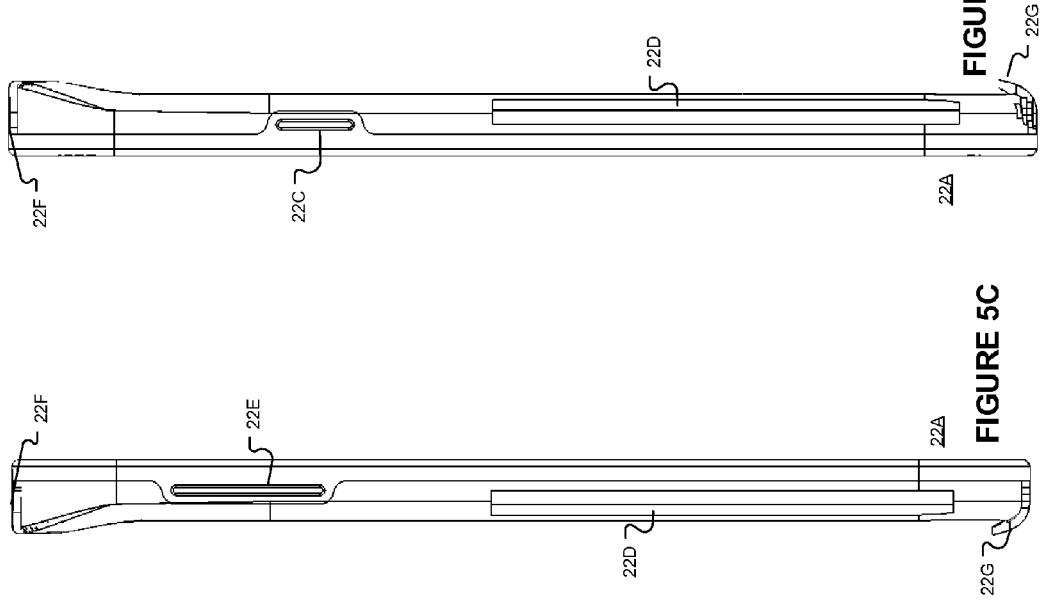

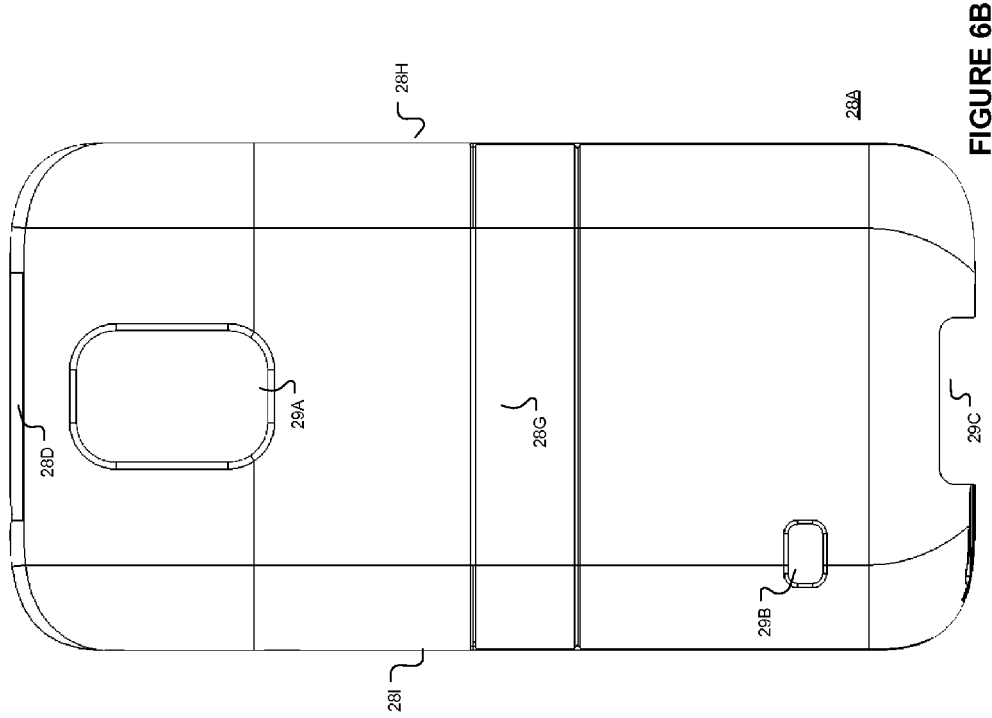
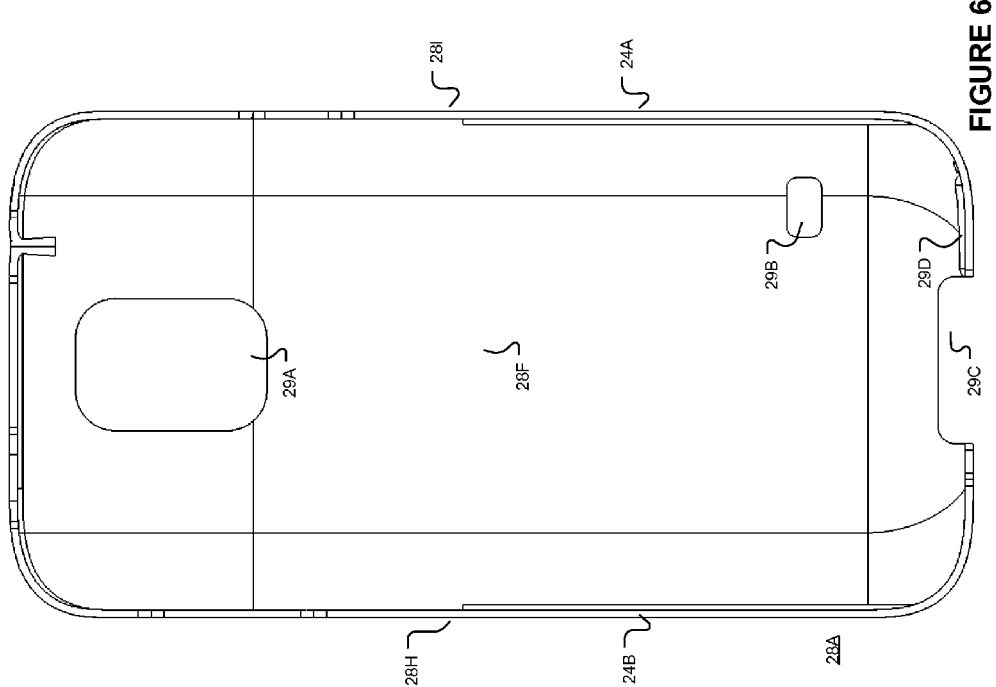

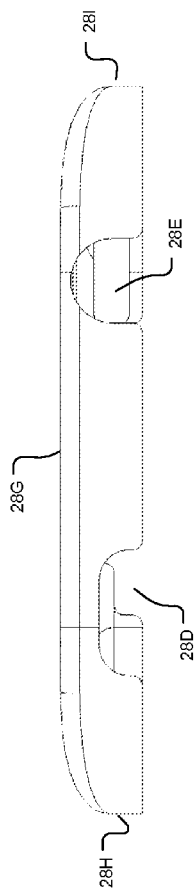
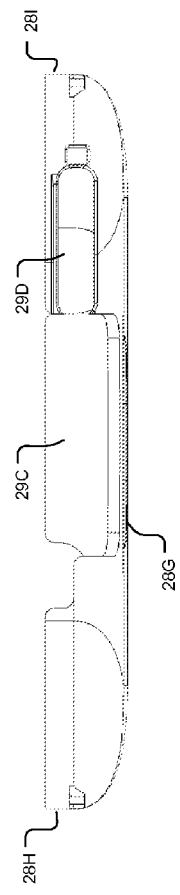
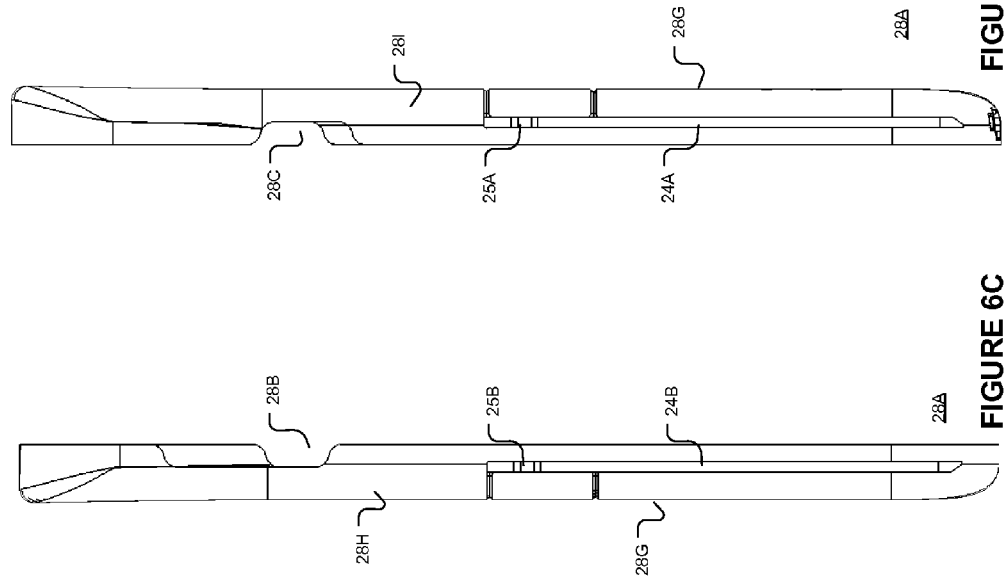

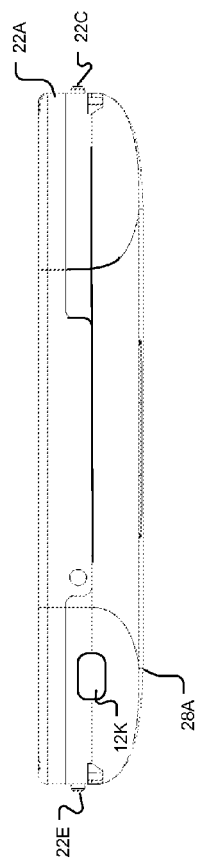
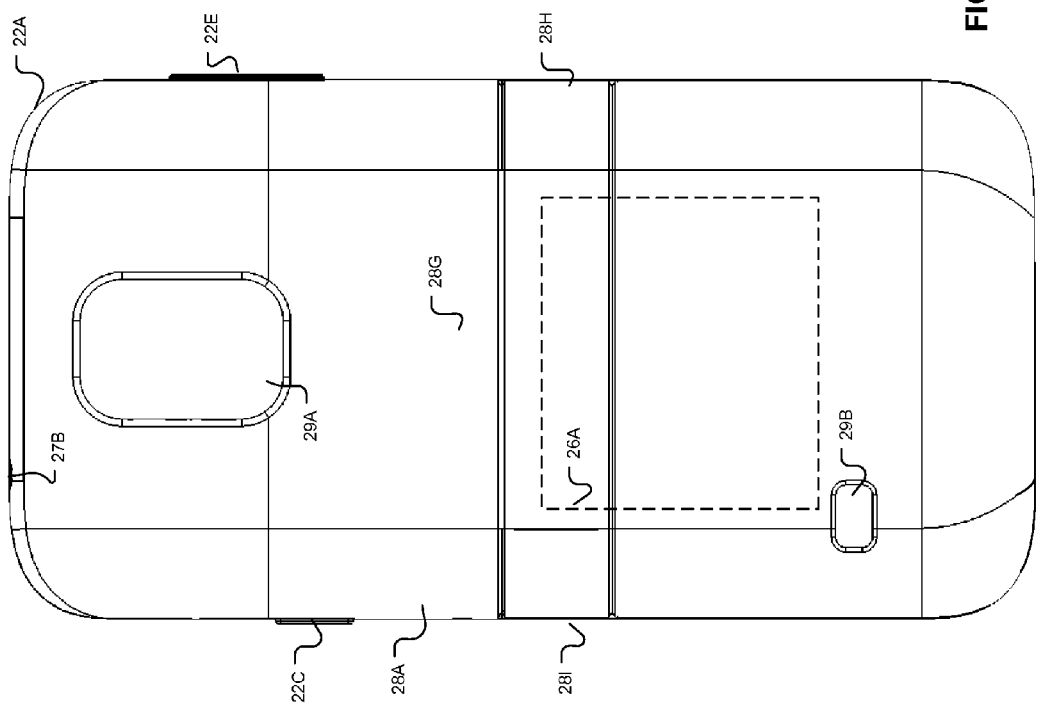
FIGURE 7D
FIGURE 7C

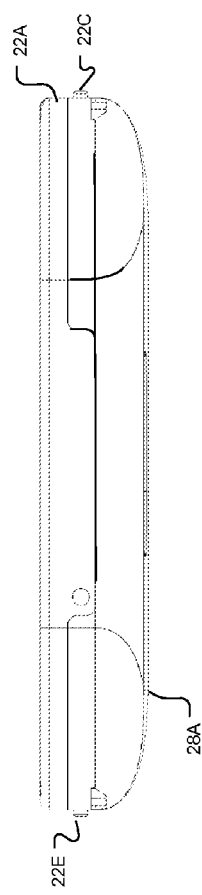
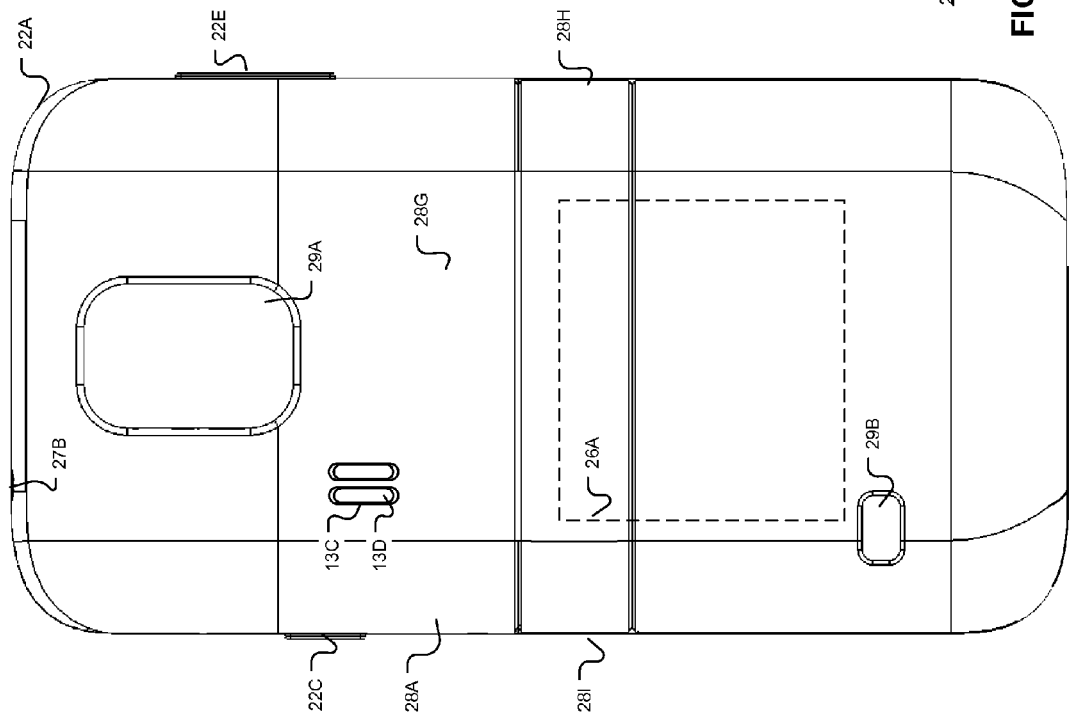
FIGURE 7F
FIGURE 7E

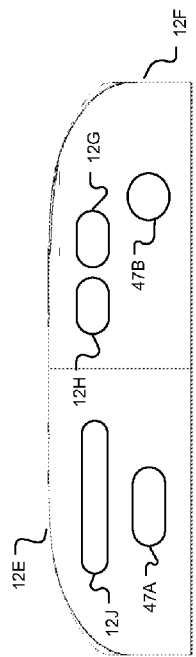
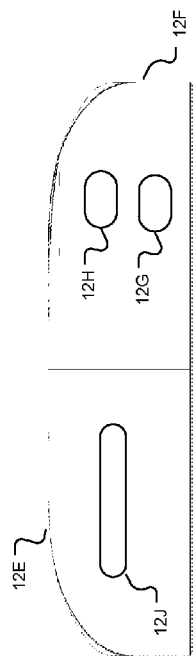
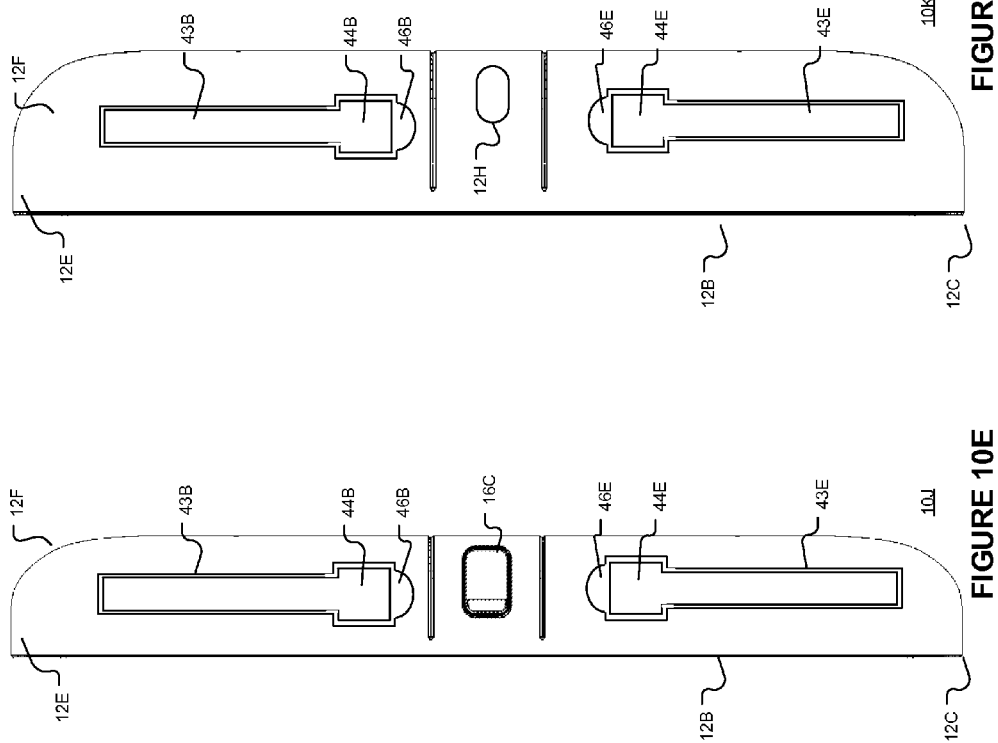
FIGURE 10G
FIGURE 10H
FIGURE 10F
FIGURE 10E

ELECTRONIC DEVICE ATTACHMENT WITH ELECTRICAL ENERGY STORAGE

CROSS-REFERENCE TO RELATED APPLICATION

This application is a national-phase entry of Patent Cooperation Treaty Application No. PCT/US2014/051961, which has an international filing date of Aug. 20, 2014, and claims the benefit of U.S. Provisional Patent Application Ser. No. 61/978,188, filed Apr. 10, 2014. This application also claims priority to Patent Cooperation Treaty Application No. PCT/US2015/023853, which has an international filing date of Apr. 1, 2015, and claims the benefit of U.S. Provisional Patent Application Ser. No. 61/978,188, filed Apr. 10, 2014, 62/100,885, filed Jan. 7, 2015, 62/109,491 filed Jan. 29, 2015 and 62/111,950, filed Feb. 4, 2015, all of which are incorporated by reference herein in their entirety.

TECHNICAL FIELD

Various embodiments described herein relate to portable electronic device (PED) additional components, in particular case and attachment components including an attachment components including an electrical energy storage element (EESE).

BACKGROUND INFORMATION

It may be desirable to provide electrical energy from a multiple component's EESE that may be coupled to one or more surfaces or edges of a PED. It may also be desirable to cover one or more sections of a PED to protect or improve handling of the PED. The present invention includes such a component, apparatus, and system.

BRIEF DESCRIPTION OF THE DRAWINGS

FIG. 2A is a simplified isometric diagram of a multicomponent powered PED attachment (MPPA) including a first component (C1) and a bottom mount second component (C2) according to various embodiments.

FIG. 2B is a simplified isometric diagram of another multicomponent powered PED attachment (MPPA) including a first component (C1) and a bottom mount second component (C2) according to various embodiments.

FIG. 2E is a simplified isometric diagram of another multicomponent powered PED attachment (MPPA) including a first component (C1) and a bottom mount second component (C2) with side located electrical contacts according to various embodiments.

FIG. 3B is a simplified front diagram of a multicomponent powered PED attachment (MPPA) first component (C1) according to various embodiments.

FIG. 3C is a simplified rear diagram of a multicomponent powered PED attachment (MPPA) first component (C1) according to various embodiments.

FIG. 3D is a simplified left side diagram of a multicomponent powered PED attachment (MPPA) first component (C1) according to various embodiments.

FIG. 3E is a simplified right side diagram of a multicomponent powered PED attachment (MPPA) first component (C1) according to various embodiments.

FIG. 3F is a simplified top diagram of a multicomponent powered PED attachment (MPPA) first component (C1) according to various embodiments.

FIG. 3G is a simplified bottom diagram of a multicomponent powered PED attachment (MPPA) first component (C1) according to various embodiments.

FIG. 3H is a simplified, enlarged, partial isometric diagram of a multicomponent powered PED attachment (MPPA) first component (C1) according to various embodiments.

FIG. 3I is a simplified, further enlarged, partial isometric diagram of a multicomponent powered PED attachment (MPPA) first component (C1) according to various embodiments.

FIG. 4A is a simplified front diagram of a multicomponent powered PED attachment (MPPA) second, powered component (C2) according to various embodiments.

FIG. 4B is a simplified rear diagram of a multicomponent powered PED attachment (MPPA) second, powered component (C2) according to various embodiments.

FIG. 4C is a simplified left side diagram of a multicomponent powered PED attachment (MPPA) second, powered component (C2) according to various embodiments.

FIG. 4D is a simplified right side diagram of a multicomponent powered PED attachment (MPPA) second, powered component (C2) according to various embodiments.

FIG. 4E is a simplified top diagram of a multicomponent powered PED attachment (MPPA) second, powered component (C2) according to various embodiments.

FIG. 4F is a simplified bottom diagram of a multicomponent powered PED attachment (MPPA) second, powered component (C2) according to various embodiments.

FIG. 4G is a simplified, enlarged, partial isometric diagram of a multicomponent powered PED attachment (MPPA) second, powered component (C2) according to various embodiments.

FIG. 4H is a simplified, further enlarged, partial isometric diagram of a multicomponent powered PED attachment (MPPA) second, powered component (C2) according to various embodiments.

FIG. 5A is a simplified front diagram of a multicomponent powered PED attachment (MPPA) first component (C1) first module according to various embodiments.

FIG. 5B is a simplified rear diagram of a multicomponent powered PED attachment (MPPA) first component (C1) first module according to various embodiments.

FIG. 5C is a simplified left side diagram of a multicomponent powered PED attachment (MPPA) first component (C1) first module according to various embodiments.

FIG. 5D is a simplified right side diagram of a multicomponent powered PED attachment (MPPA) first component (C1) first module according to various embodiments.

FIG. 5E is a simplified top diagram of a multicomponent powered PED attachment (MPPA) first component (C1) first module according to various embodiments.

FIG. 5F is a simplified bottom diagram of a multicomponent powered PED attachment (MPPA) first component (C1) first module according to various embodiments.

FIG. 6A is a simplified front diagram of a multicomponent powered PED attachment (MPPA) first component (C1) second module according to various embodiments.

FIG. 6B is a simplified rear diagram of a multicomponent powered PED attachment (MPPA) first component (C1) second module according to various embodiments.

FIG. 6C is a simplified left side diagram of a multicomponent powered PED attachment (MPPA) first component (C1) second module according to various embodiments.

FIG. 6D is a simplified right side diagram of a multicomponent powered PED attachment (MPPA) first component (C1) second module according to various embodiments.

FIG. 6E is a simplified top diagram of a multicomponent powered PED attachment (MPPA) first component (C1) second module according to various embodiments.

FIG. 6F is a simplified bottom diagram of a multicomponent powered PED attachment (MPPA) first component (C1) second module according to various embodiments.

FIG. 7C is a simplified rear diagram of a multicomponent powered PED attachment (MPPA) first component (C1) according to various embodiments.

FIG. 7D is a simplified bottom diagram of a multicomponent powered PED attachment (MPPA) first component (C1) according to various embodiments.

FIG. 7E is a simplified rear diagram of another multicomponent powered PED attachment (MPPA) first component (C1) according to various embodiments.

FIG. 7F is a simplified bottom diagram of a multicomponent powered PED attachment (MPPA) first component (C1) according to various embodiments.

FIG. 10E is a simplified side diagram of a multicomponent powered PED attachment (MPPA) PED top or bottom mounted second, powered component (C2) with multiple deployable side based power connectors on a single side according to various embodiments.

FIG. 10F is a simplified side diagram of a multicomponent powered PED attachment (MPPA) PED top or bottom mounted second, powered component (C2) with a larger cavity and multiple deployable side based power connectors on a single side according to various embodiments.

FIG. 10G is a simplified top diagram of a multicomponent powered PED attachment (MPPA) PED top mount second, powered component (C2) with multiple power connectors and a memory card interface according to various embodiments.

FIG. 10H is a simplified top or bottom diagram of a multicomponent powered PED attachment (MPPA) PED top or bottom mount second, powered component (C2) with multiple power connectors and a memory card interface according to various embodiments.

DETAILED DESCRIPTION

Portable electronic devices (PED) 30A including mobile phones, laptops, tablets, cameras, electronic book readers, electronic sport and health devices, and other portable electronic devices may include an electrical energy storage element (EESE) (a battery in an embodiment) that enables the PED to operate without another power source. Depending on its function and a user's activity, a PED may deplete its EESE before a user has access to a power source. To extend usage time or functionality of one or more PEDs, a user may bring a portable EESE source along with one or more PEDs. Portable EESE components, apparatus, systems, and devices 10A-10Q according to various embodiments may be releasably attachable to a PED 30A. Such an EESE component, apparatus, system, or device 10A-10Q may enable a user to reduce the item number they may need to carry or transport.

An EESE component, apparatus, system, or device 10A-10Q according to various embodiments may include one or more electrical connectors and an inductor to communicate electrical energy between an EESE of the component, apparatus, system, or device 10A-10Q and an PED 30A including providing electrical energy to a PED 30A and receiving electrical energy from a PED 30A. In an embodiment, an EESE component, apparatus, system, or device 10A-10Q electrical connector or inductor may be able to receive and transmit electrical energy sufficient to charge its EESE or power a PED 30A. An EESE component, apparatus, system, or device 10A-10Q may include one or more deployable electrical connectors coupled to the EESE component, apparatus, system, or device 10A-10Q via a flexible cable. Such an EESE component, apparatus, system, or device 10A-10Q may limit the cable number a user may need to transport to provide energy to a PED 30A.

A PED 30A may have one or more screens or displays 30A, cameras 32B, control buttons 32F, speakers 32D, communication devices 32C, and other elements that are ideally not blocked or covered by a coupled apparatus 10A-10Q components. A PED 30A structurally may have a front, back, left side, right side, top, and bottom, and a perimeter coupling its front, back, left side, right side, top, and bottom. In an embodiment, an apparatus 10A-10Q component may be coupled to a PED 30A from its, back, front, top, bottom, left side, or right side. In an embodiment, an apparatus 10A-10Q component may be slidably coupled to a rear section of a PED 30A from the PED 30A top, bottom, left side, or right side. In an embodiment, an apparatus 10A-10Q first component may be coupled one or more sections of a PED 30A perimeter and an apparatus 10A-10Q second component may slidably coupled to the PED 30A over its first component.

Figure 1B:
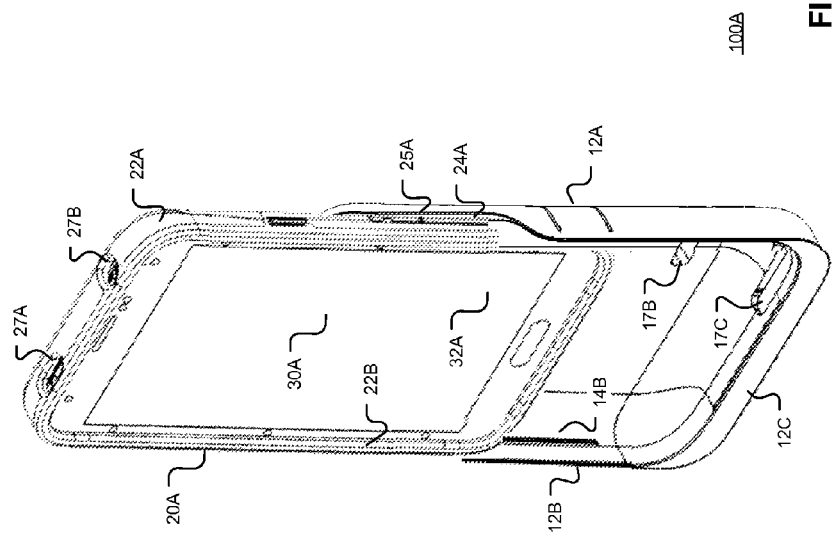
FIG. 1B is a simplified isometric diagram of a multicomponent powered PED attachment (MPPA) with a first component (C1) coupled to a portable electronic device (PED) and being further slidably coupled toward a PED bottom mount second, powered component (C2) according to various embodiments.
Figure 1A:
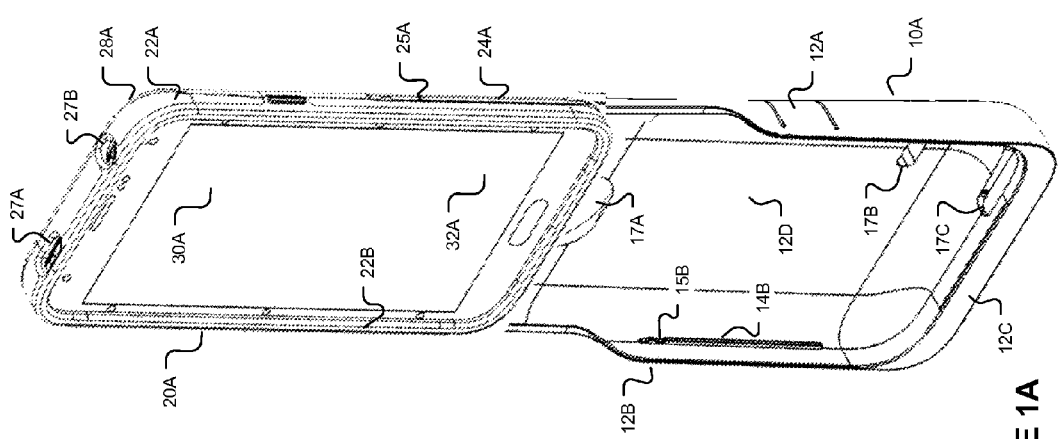
FIG. 1A is a simplified isometric diagram of a multicomponent powered PED attachment (MPPA) with a first component (C1) coupled to a portable electronic device (PED) and being slidably coupled toward a PED bottom mount second, powered component (C2) according to various embodiments.

FIG. 1A is a simplified isometric diagram of architecture 100A including a multicomponent powered PED attachment (MPPA) system or apparatus 5A being coupled to a portable electronic device (PED) 30A. The MPPA system 5A may include a first component (C1) 20A and a second component (C2) 10A. In an embodiment, the first component (C1) 20A may be slidably couplable to the second component (C2) 10A from the PED 30A bottom or base. As shown in FIG. 1A, the C1 20A may be configured to securely encompass a portion of a portable electronic device (PED) 30A. The C2 10A may include a power/data module 110A, 110B, 110C (FIGS. 11A, 11B, and 11D) that may communicate electrical energy with a portable electronic device (PED) 30A when the C1 20A is coupled to the C2 10A. In an embodiment, a MPPA system 5A may provide electrical energy to a PED 30A and receive electrical energy from a PED 30A.

The MPPA system 5A first component (C1) 20A may include rail openings 24A, 24B that are sized and configured to slidably mate with the second component (C2) 10A rails 14A, 14B. The MPPA system 5A first component (C1) 20A may include rail extensions 25A, 25B that are sized and configured to slidably mate with the second component (C2) 10A rails depressions 15A, 15B. In an embodiment, the C1 20A may slide downwardly from the C2 10A top edge 12E toward the C2 10A base 12C until the rail extensions 25A, 25B mate with the second component (C2) 10A rails depressions 15A, 15B, providing a resistive force to further movement of the C1 20A relative to the C2 10A downwardly or upwardly along the rails C2 10A rails 14A, 14B.

As shown in FIG. 1A, the MPPA system 5A first component (C1) 20A may include an outer perimeter 22A and an inner device mating module shell 211A. The MPPA system 5A second component (C2) 10A may include a right shoulder 12A, a left shoulder 12B, a base 12C, inner back 12D, top edge 12E, and an outer back 12F. The second component (C2) 10A right shoulder 12A inner side adjacent the inner back 12D may include the right rail 14A. The second component (C2) 10A left shoulder 12B inner side adjacent the inner back 12D may include the left rail 14B. The second component (C2) 10A may include openings or fenestrations 17A, 17B, 17C that correspond to one or more electronic device 30A components including a camera 32B, a near field communication module 32C, and a speaker 32D. The first component (C1) 20A perimeter 22A may include openings or fenestrations 27A, 27B, 27C that correspond to one or more electronic device 30A components including a headphone jack port 32E, a user control module 32F, and an electronic interface module 32G. The outer per FIG. 1B is a simplified isometric diagram of a multicomponent powered PED attachment (MPPA) 5A with the first component (C1) 20A being coupled to a portable electronic device (PED) 30A. The PED 30A and C1 20A are being further advanced toward the second, powered component (C2) 10A via the PED 30A base or bottom and rear section according to various embodiments. FIG. 1C is a simplified isometric diagram of a multicomponent powered PED attachment (MPPA) 5A with a first component (C1) 20A coupled to a portable electronic device (PED) 30A and fully engaged with a second, powered component (C2) 10A according to various embodiments. As noted, the MPPA system 5A first component (C1) 20A may include rail openings 24A, 24B that are sized and configured to slidably mate with the second component (C2) 10A rails 14A, 14B. In an embodiment, the railing openings 24A, 24B and rails 14A, 14B are sized so the C1 20A may slide with a small or little resistance between the components C1 20A, C2 10A.

In an embodiment, a MPPA system 5A first component (C1) 20A may further include rail extensions 25A, 25B that are sized and configured to slidably mate with the second component (C2) 10A rails depressions 15A, 15B. In an embodiment, once the C1 20A is further advanced and coupled to the C2 10A as shown in FIG. 1C, the rail extensions 25A, 25B may be adjacent and coupled/mated with the second component (C2) 10A rails depressions 15A, 15B. Such mating between the extensions 25A, 25B and depressions 15A, 15B may provide a resistive force sufficient to prevent the C1 20A from decoupling from the C2 10A unintentionally. The resistive force, however may be overcome by a user intending to separate the components C1 20A, C2 10A by advancing the C1 20A upwardly away from the C2 10A as shown in FIGS. 1A and 1B.

Figure 1D:
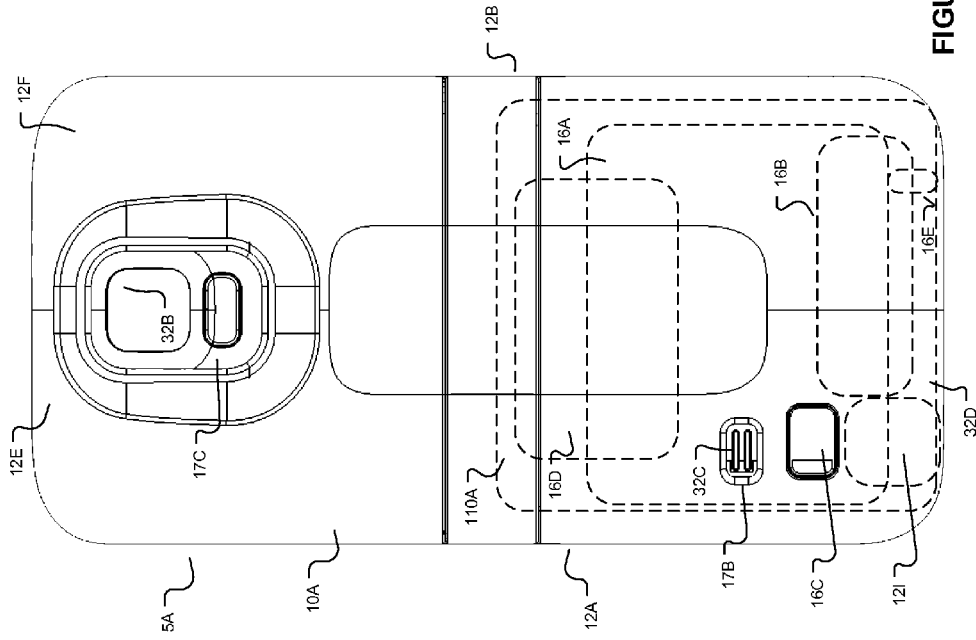
FIG. 1D is a simplified rear diagram of a multicomponent powered PED attachment (MPPA) with a first component (C1) coupled to a portable electronic device (PED) and engaged with a second, powered component (C2) via the PED base according to various embodiments.
Figure 1C:
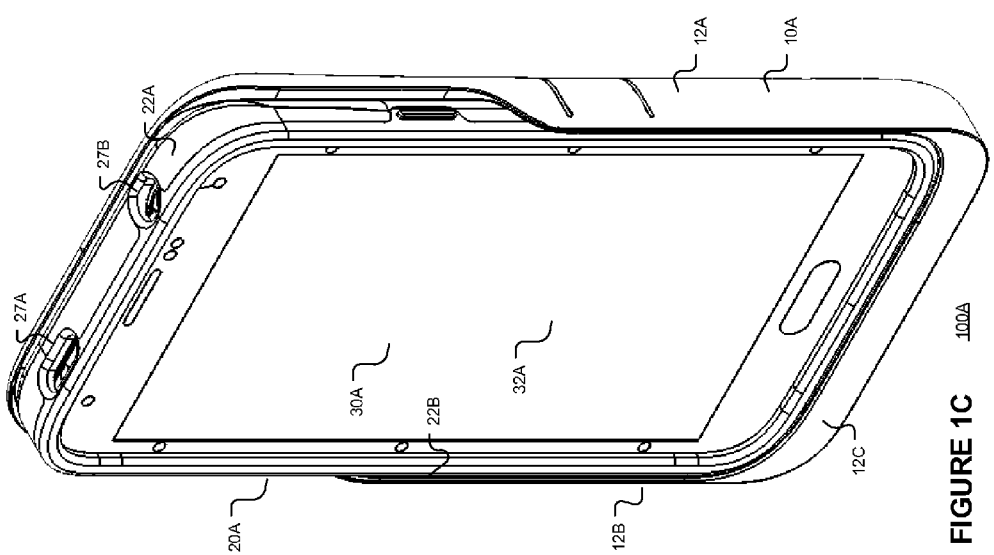
FIG. 1C is a simplified isometric diagram of a multicomponent powered PED attachment (MPPA) with a first component (C1) coupled to a portable electronic device (PED) and slidably engaged with a second, powered component (C2) according to various embodiments.
Figure 11B:
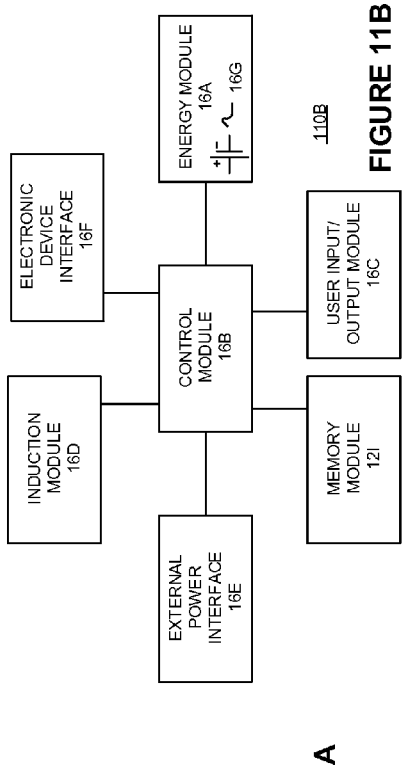
FIG. 11B is a simplified block diagram of an induction based and a connector based power module according to various embodiments.

FIG. 1D is a simplified rear diagram of architecture 100A including a multicomponent powered PED attachment (MPPA) 5A with a first component (C1) 20A coupled to a portable electronic device (PED) 30A and fully engaged with a second, powered component (C2) 10A according to various embodiments. As shown in FIG. 1D, the C2 10A has a plurality of openings or fenestrations 17A and 17B that may correspond to one or more electronic device 30A components including a camera 32B and a near field communication module 32C. As also shown in FIG. 1D, the second component 10A may include an induction based power/data module 110A. As shown in FIG. 1D and FIG. 11A, the induction based power/data module 110A may include an electrical energy storage module 16A, a control module 16B, a user control-display module 16C, an inductive charging module 16D, a memory module 12I, and an external power interface 16E. The power/data module 110A may provide power to a portable electronic device (PED) 30A via induction (via the induction module 16D). The power/data module 110A may receive electrical energy via induction (the induction module 16D) or directly via the external power interface module 16E.

The memory module 12I may include an internal volatile or non-volatile memory and a data memory storage interface ("DMSI") module 12J as shown in FIGS. 10G and 10H. The data memory storage interface ("DMSI") module 12J may interface with one or more memory devices including a compact flash card, secure digital (SD), miniSD, microSD, SD high capacity (SDHC), miniSDHC, microSDHC, SD extended capacity, and memory stick. The DMSI 12J may conform to the SD input-output (SDIO) standard to enable a data memory card and other devices to communicate electronic data with a PED via a power/data module 110A inductively in addition to providing power inductively. Data may be encoded using one or more communication protocols where is the magnetic field is modulated to communicate data in addition to power between a PED and a power/data module 110A.

Figure 11D:
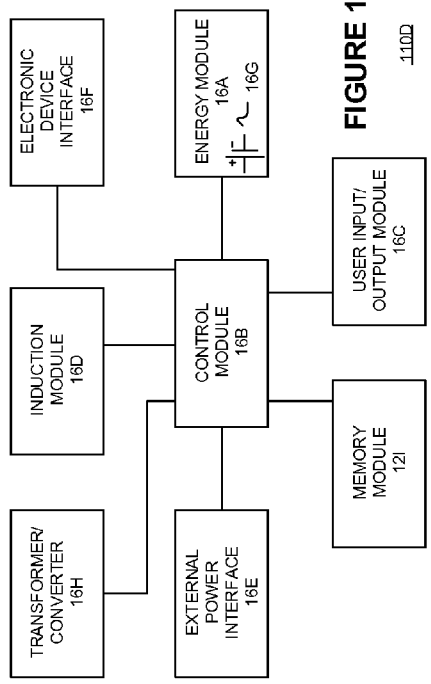
FIG. 11D is a simplified block diagram of another induction based and a connector based power module according to various embodiments.
Figure 11A:
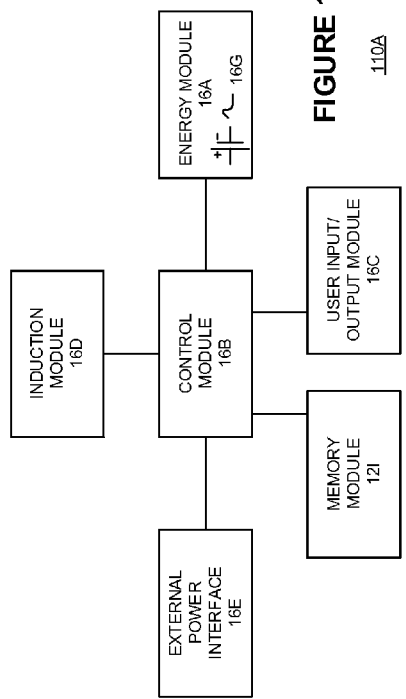
FIG. 11A is a simplified block diagram of an induction based power module according to various embodiments.
Figure 11C:
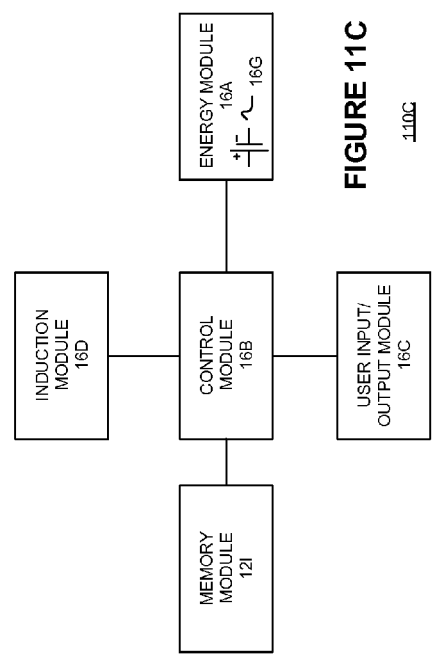
FIG. 11C is a simplified block diagram of an induction-only based power module according to various embodiments.

In another embodiment shown in FIG. 11C, a C2 power/data module 110C may be induction based only. The induction only power/data module 110C may not include an external power interface 16E. The power/data module 110C may provide power and data to a portable electronic device (PED) 30A via induction (via the induction module 16D). The power/data module 110C may receive electrical energy and data via induction (the induction module 16D). In a further embodiment shown in FIG. 11B, a power/data module 110B may include a portable electronic device (PED) interface 16F and an induction module 16D. The power/data module 110B may provide power and data to a portable electronic device (PED) 30A via induction or a direct connection (via electronic device interface module 16F). The power/data module 110B may also receive electrical energy and data via induction (the induction module 16D) or directly via the external power interface module 16E.

FIG. 11D is a simplified block diagram of another power/data module 110D according to various embodiments. The power/data module 110D may provide power and data to a portable electronic device (PED) 30A via a direct connection (via electronic device interface module 16F) or induction (16D). The power/data module 110D may receive electrical energy and data directly via the external power interface module 16E or induction module 16D. In an embodiment a power/data module's 110A-110D electrical energy storage module 16A may include one or more elements capable of storing and discharging electrical energy. The elements may include batteries, capacitors, or other energy storage devices. The user control-display module 16C may include one or more user controllable input elements and one or more user perceptible output elements. The input elements may include a slidable or depressible element. The output elements may include user detectable devices including light generation or sound generation devices. The light generation devices may include one or more light emitting diodes and color changing devices.

Figure 2C:
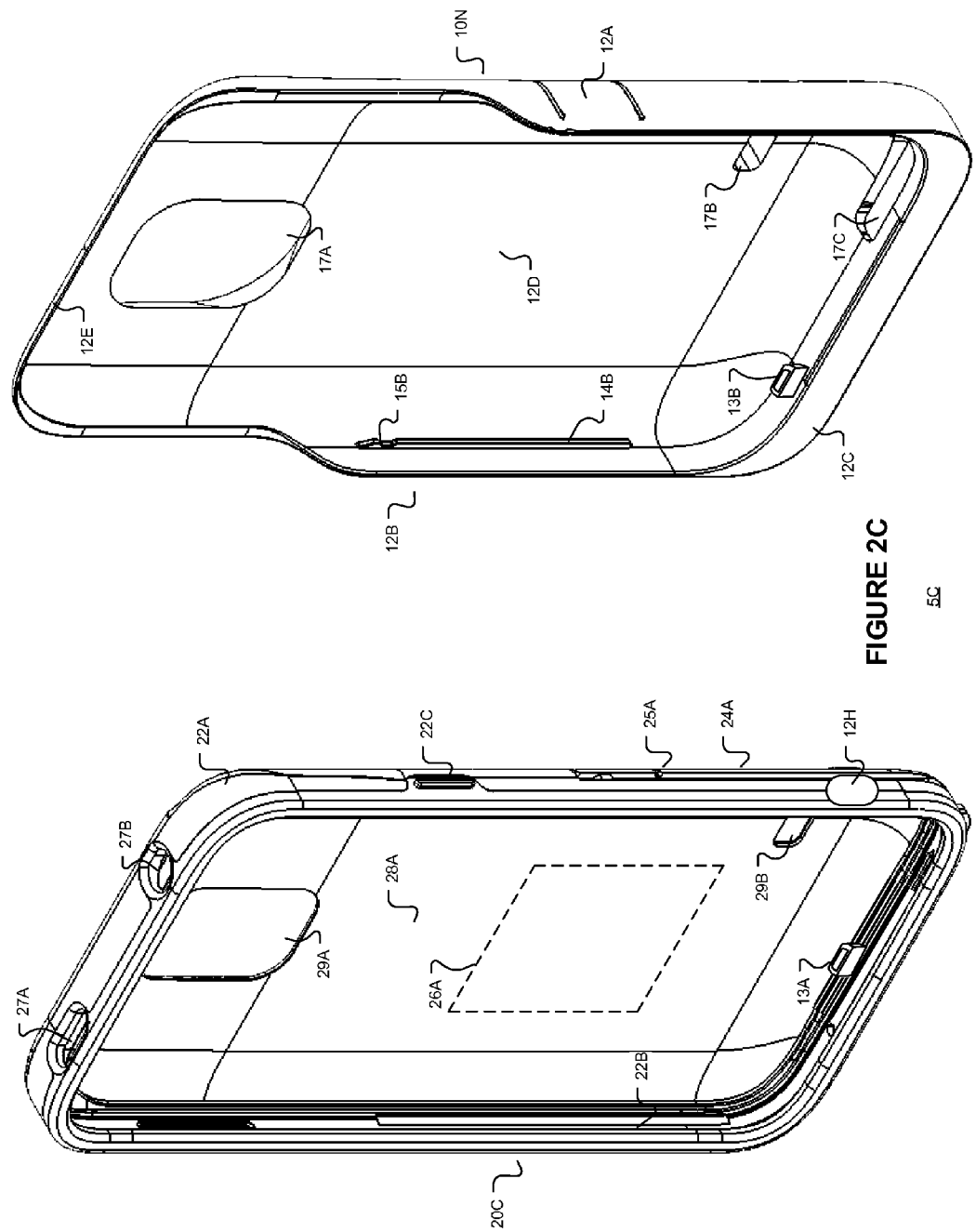
FIG. 2C is a simplified isometric diagram of another multicomponent powered PED attachment (MPPA) including a first component (C1) and a bottom mount second component (C2) according to various embodiments.
Figure 2D:
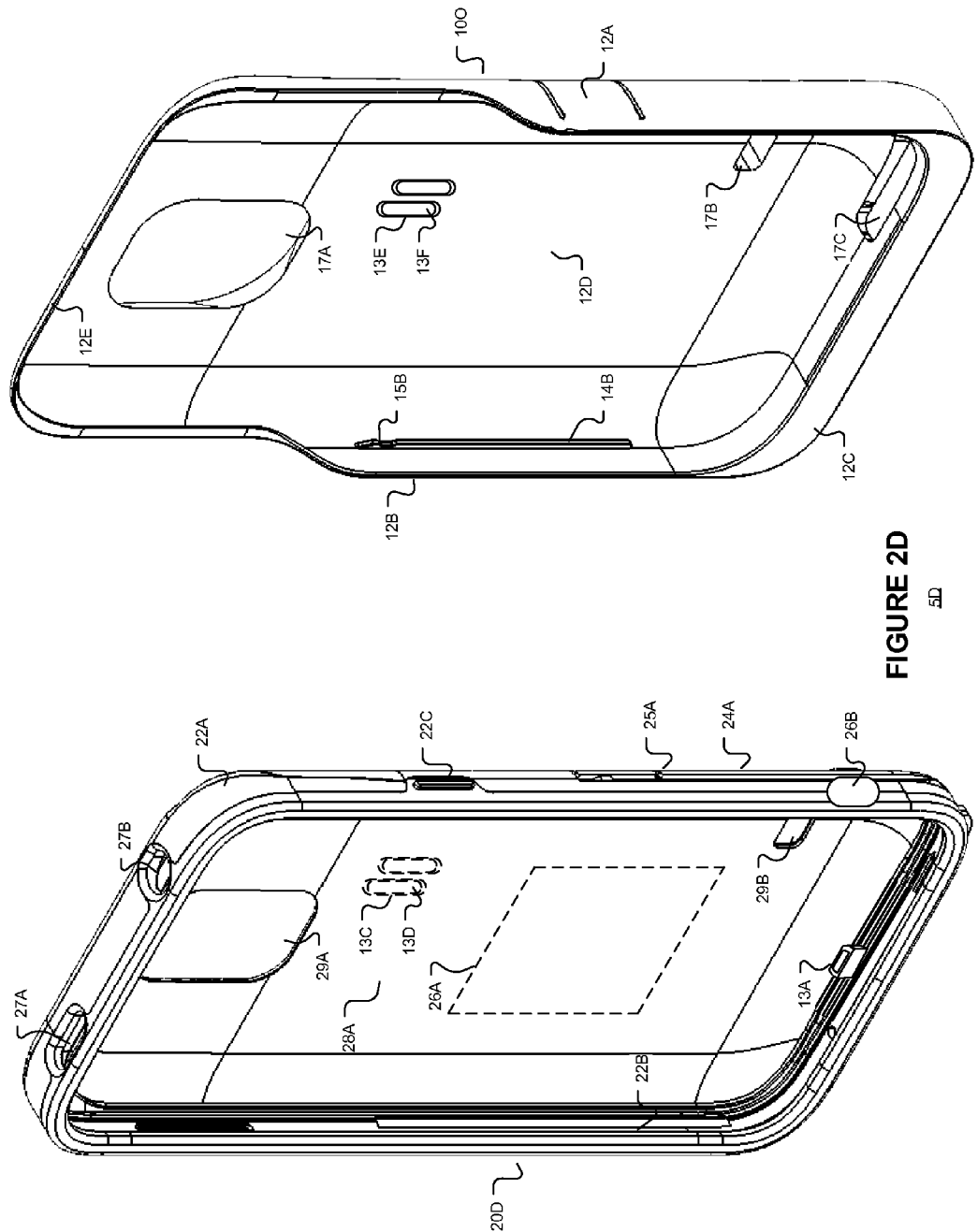
FIG. 2D is a simplified isometric diagram of another multicomponent powered PED attachment (MPPA) including a first component (C1) and a bottom mount second component (C2) with back located electrical contacts according to various embodiments according to various embodiments.

In a power/data module 11B-11D, an electronic device interface 16F may include communicate with a PED interface 13A such as shown in FIGS. 2B, 2D, and 2E. The interface 16F may also communicate data and power with a PED via connectors 44A, 44B shown in FIGS. 8A, 8B, 8C, 8D, 9A, 9B, 9C, 9D, 10A, 10C, 10D, 10I, 10J, 10K, 10L, connectors 44C, 44D shown in FIGS. 10B, 10C, 10D, 10K, and connectors 44E shown in FIG. 10E, 10F.

The inductive charging module 16D may include a primary coil that generates a magnetic field. The magnetic field may module power and data signals in an embodiment. A portable electronic device (PED) 30A may include a complementary secondary coil that may induce a current from the magnetic field. The current signal may include a power signal and a modulate data signal. In an embodiment, the inductive charging module 16D may induce an electric current from a magnetic field generated by another induction coil. In such an embodiment, a power module's 110A-C induction module 16D may receive electrical energy and modulated data from another induction module and provide electrical energy and modulated data to another induction module. In a power/data module 110A, 110B, 110D including a external power interface, the power module may receive electrical energy and data directly from an external interface 13A, 44A-44E. In power modules 110A-D, the received electrical energy may be used to charge or increase storage levels of the energy module 16A. An energy module 16A may include one or more EESE 16G. An EESE 16G may be any device capable of storing and discharging electrical energy including a battery and capacitor. The received electrical energy may be used to provide electrical energy to a portable electronic device (PED) 30A directly or via induction.

A user may determine or control whether a power/data module 110A-110D provides electrical energy or data to a portable electronic device (PED) 30A via the user input-output module 16C. A user may also note the operational status of a power/data module 110A-D via the user input-output module 16C. The output signal may indicate whether a power/data module 110A-D is receiving electrical energy, discharging electrical energy, the energy module 16A storage level, data communication status (between memory module 12I and PED in an embodiment). The user input-output module 16C may employ one or more light generation modules to provide such indications including color changing modules.

In an embodiment, a power/data module 110A-D control module 16B may include a printed circuit board (PCB), processor, and application specific integrated circuit (ASIC). A control module 16B based on the user selection via the user input-output module 16C may provide energy to a portable electronic device (PED) 30A. The control module 16B may direct energy from the energy storage module 16A or an external source (via the induction module 16D or external power interface 16E) as a function of the energy level from an external source, the energy storage module 16A level, and user selection. The control module 16B may provide electrical energy to a portable electronic device (PED) 30A via the induction module 16D or electronic device interface 16F as a function of the electronic device 30A and user selection in an embodiment. The electronic device interface 16F may have or conform to a standardized interface including compiling with a universal serial bus (USB) protocol or a device specific interface. Similarly, the external power interface 16E may have or conform to a standardized interface including compiling with a universal serial bus (USB) protocol or a device specific interface.

Figure 1F:
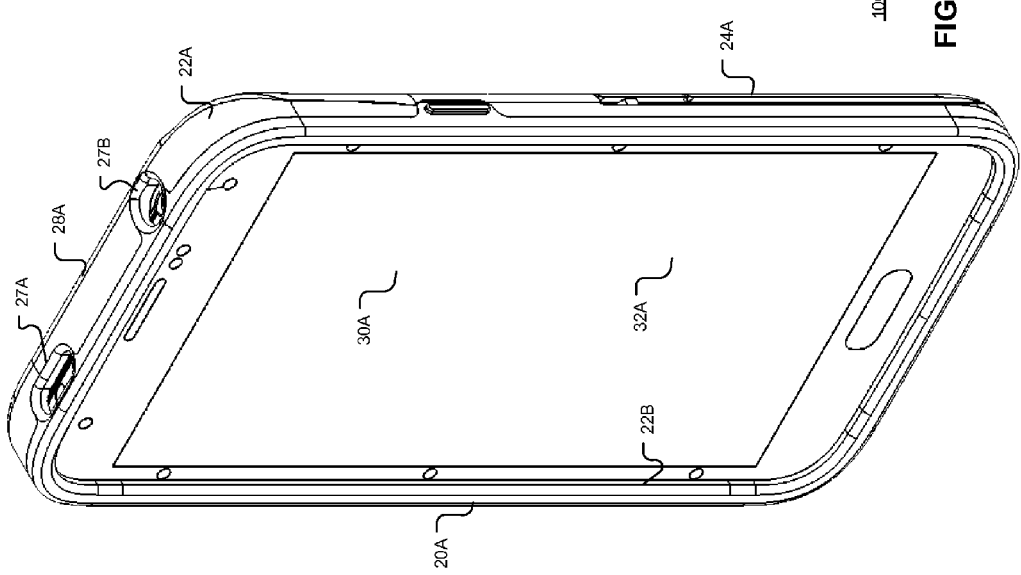
FIG. 1F is a simplified isometric diagram of a multicomponent powered PED attachment (MPPA) first component (C1) first module and second module coupled to a portable electronic device (PED) according to various embodiments.
Figure 1E:
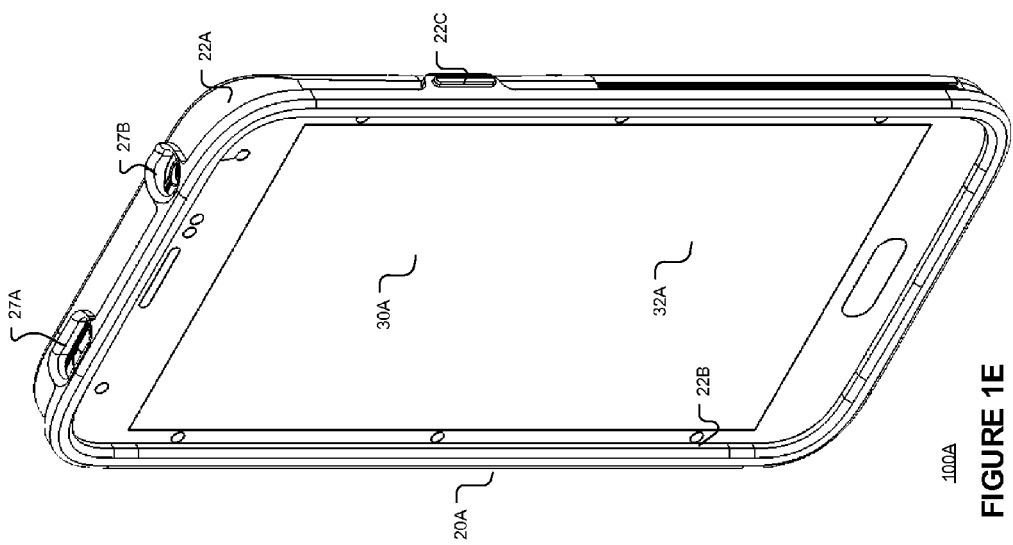
FIG. 1E is a simplified isometric diagram of a multicomponent powered PED attachment (MPPA) first component (C1) first module coupled to a portable electronic device (PED) according to various embodiments.

FIG. 1E is a simplified isometric diagram of a multicomponent powered PED attachment (MPPA) 5A first component (C1) first module 22A coupled to a portable electronic device (PED) 30AA according to various embodiments. In an embodiment, a MPPA 5A first component C1 20A may include two separable modules 22A and 211A. Module 22A may be a perimeter module and formed of an at least semi-flexible material including an elastomer, polymer, rubber, and silicon. The other C1 20A module 211A may be a rear shell and formed of a more rigid or similar flexible material. In an embodiment, the C1 20A perimeter module 22A may be installed or coupled to a portable electronic device (PED) 30A perimeter. Then the C1 20A rear shell 211A may be coupled to the C1 20A perimeter module 22A and electronic device 30A as shown in FIG. 1F.

In another embodiment, the C1 211A rear shell 211A may be installed, coupled, or held temporarily to a portable electronic device (PED) 30A rear section. Then the C1 20A perimeter module 22A may be coupled to the C1 20A rear shell 211A and electronic device 30A. In a further embodiment, the C1 20A perimeter module 22A and C1 20A rear shell 211A may be coupled together. Then the combined C1 20A modules 22A and 211A may be coupled to the electronic device 30A. In an embodiment, the C1 20A perimeter module 22A and C1 20A rear shell 211A may be fixably coupled together when provided to a user for installation on a user device 30A.

The C1 20A first perimeter module 22A may include an inward lip 22B that is over and covers a portion of the electronic device's 30A face 32A. The C1 20A second, shell module 211A may cover a portion of the electronic device's 30A rear section other than one or more openings 29A, 29B formed to expose one or more electronic device's 30A elements 32B, 32C. The MPPA 5A first component C1 20A may cover, protect, and provide ease of handling of a portable electronic device (PED) 30A. When additional support or power is needed for a portable electronic device (PED) 30A, a user may couple the electronic device 30A to the MPPA 5A second component 20A via the first component 10A as shown in FIGS. 1A-1C. Upon coupling the first component C1 with the second component C2, the MFC 5A power/data module 110A-D may automatically provide power to the electronic device 30A via an induction module 16D or electronic device interface 16F. In an embodiment, a user may direct the power/data module 110A-D via the user input-output module 16C to provide power to the electronic device 30A via an induction module 16D or electronic device interface 16F.

FIG. 2A is a simplified isometric diagram of a multicomponent powered PED attachment (MPPA) 5A components C1 20A and C2 10A according to various embodiments. The MPPA 5A shown in FIG. 2A may include a power/data module 110A or 110C and not include a portable electronic device (PED) interface 16F. As shown in FIG. 2A, the components C1 20A and C2 10A may openings 29A, 17A and 29B, 17B that are co-aligned when the components C1 20A and C2 10A are fully coupled as shown in FIGS. 1C and 1D. Only the first component C1 20A includes openings 27A and 27B for other electronic device 30A elements since the second component C2 10A does not fully enclose the electronic device 30A perimeter or periphery as shown in FIGS. 1A-1D. In addition, the second component C2 10A sides 12A, 12B do not extend fully along the electronic device 30A sides as shown in FIGS. 1A-1D. Then configuration may enable a user to more easily remove or separate the C1 20A from C2 10A when desired by creating gripping areas on the C1 20A perimeter 22A above the C2 10A arms 12A, 12B.

FIG. 2B is a simplified isometric diagram of a multicomponent powered PED attachment (MPPA) 5B components C1 20B and C2 10B according to various embodiments. The MPPA 5B shown in FIG. 2B may include a power/data module 110B or 110D and include a portable electronic device (PED) interface 16F. The component C2 10B may include a portable electronic device (PED) connector 13A as shown in FIG. 2B. The connector 13A may be placed to align a corresponding electronic 30A electronic interface module 32G. The connector 13A may be electrically coupled to a power/data module 110B, 110D electronic device interface 16F. The MPPA 5B first component C1 10B may include an opening 29E that is co-aligned with the C2 20B connector 13A. The opening 29E may enable the connector 13A to extend through the C1 10B to a portable electronic device (PED) 30A interface 32G when the C1 10B is fully coupled to the C2 20B and a portable electronic device (PED) 30A is coupled to the C1 20B.

FIG. 2C is a simplified isometric diagram of another multicomponent powered PED attachment (MPPA) 5C components C1 20C and C2 10N according to various embodiments. The MPPA 5C shown in FIG. 2C may include a power/data module 110B or 110D and include a portable electronic device (PED) interface 16F. In the MPPA 5C, the component C1 20C may include a portable electronic device (PED) connector 13A as shown in FIG. 2C. The connector 13A may be placed to align a corresponding electronic device 30A electronic interface module 32G. The connector 13A may be electrically coupled to a power/data module 110B, 110D electronic device interface 16F (directly or indirectly when coupled to C2 10N). The C1 20C may also include an electrical energy storage element (EESE) 26A. The C1 20C EESE 26A may provide electrical energy to an electronic device 30A coupled to the C1 20C connector 13A.

The second component (C2) 10N may include a C1 20C interface 13B. The interface 13B may couple an electronic device 30A to the C2 10N via the combination of the C1 20C ED 30A interface 13A and C2 10N C1 interface 13B. FIG. 7C is a simplified rear diagram and FIG. 7D is a simplified bottom diagram of the MPPA 5C first component C1 20C according to various embodiments. As shown in FIG. 7D, the C1 20C may include an interface 12K shaped to receive the second component C2 10N C1 electrical interface 13B. The interfaces 13A, 13B may include contacts to communicate power and data between components C1 20C, C2 10N, and a coupled electronic device 30A.

FIG. 2D is a simplified isometric diagram of another multicomponent powered PED attachment (MPPA) 5D components C1 20D and C2 100 according to various embodiments. The MPPA 5D shown in FIG. 2D may also include a power/data module 110B or 110D and include a portable electronic device (PED) interface 16F. In the MPPA 5D, the component C1 20D may include a portable electronic device (PED) connector 13A as shown in FIG. 2D. The connector 13A may be placed to align a corresponding electronic device 30A electronic interface module 32G. The connector 13A may be electrically coupled to a power/data module 110B, 110D electronic device interface 16F (directly or indirectly when coupled to C2 100). The C1 20D may also include an electrical energy storage element (EESE) 26A. The C1 20D EESE 26A may provide electrical energy to an electronic device 30A coupled to the C1 20D electrical connector 13A.

FIG. 7E is a simplified rear diagram and FIG. 7F is a simplified bottom diagram of the MPPA 5D first component C1 20D according to various embodiments. As shown in FIG. 7E and FIG. 2D, a C1 20D may include several contacts 13C with depressible or protruding sections 13D sized and located on the C1 20D rear section 28G. The second component (C2) 100 may include several contacts 13E with protruding or depressible sections 13F sized and located on the C2 10N inner rear section 12D. The electrical contacts 13C, 13E may couple an electronic device 30A to the C2 100 when the C2 100 is slidably coupled to the C1 20D. The contacts 13C, 13E may communicate power and data between components C1 20C, C2 10N, and a coupled electronic device 30A.

FIG. 2E is a simplified isometric diagram of another multicomponent powered PED attachment (MPPA) 5E components C1 20E and C2 10P according to various embodiments. The MPPA 5E shown in FIG. 2E may also include a power/data module 110B or 110D and include a portable electronic device (PED) interface module 16F. In the MPPA 5E, the component C1 20E may include a portable electronic device (PED) connector 13A coupled to the interface module 16F as shown in FIG. 2E. The connector 13A may be placed to align a corresponding electronic device 30A electronic interface module 32G. The connector 13A may be electrically coupled to a power/data module 110B, 110D electronic device interface 16F (directly or indirectly when coupled to C2 10N). The C1 20E may also include an electrical energy storage element (EESE) 26A. The C1 20E EESE 26A may provide electrical energy to an electronic device 30A coupled to the C1 20D electrical connector 13A.

As shown in FIG. 2E, a C1 20E may include several contacts 13C with depressible or protruding sections 13D sized and located on the C1 20D perimeter 22A. The second component (C2) 10P may include several contacts 13E with protruding or depressible sections 13F sized and located on the C2 10P inner shoulder 12A, 12B to engage and electrical couple the contacts 13C when the C1 20E is coupled to the C2 10P. The electrical contacts 13C, 13E may couple an electronic device 30A to the C2 10P when the C2 10P is slidably coupled to the C1 20E. The contacts 13C, 13E may communicate power and data between components C1 20E, C2 10P, and a coupled electronic device 30A.

The component C1 20E may include a user control-display module 26C on a rear section 28A. The module 26C may include one or more user controllable input elements and one or more user perceptible output elements. The input elements may include a slidable or depressible element. The output elements may include user detectable devices including light generation or sound generation devices. The light generation devices may include one or more light emitting diodes and color changing devices. A user may determine or control whether a power/data module 110A-110D provides electrical energy or data to a portable electronic device (PED) 30A via the user input-output module 26C. A user may also note the operational status of a power/data module 110A-D via the user input-output module 26C. The output signal may indicate whether a power/data module 110A-D is receiving electrical energy, discharging electrical energy and the energy module 26A storage level. The user input-output module 26C may employ one or more light generation modules to provide such indications including color changing modules.

Figure 3A:
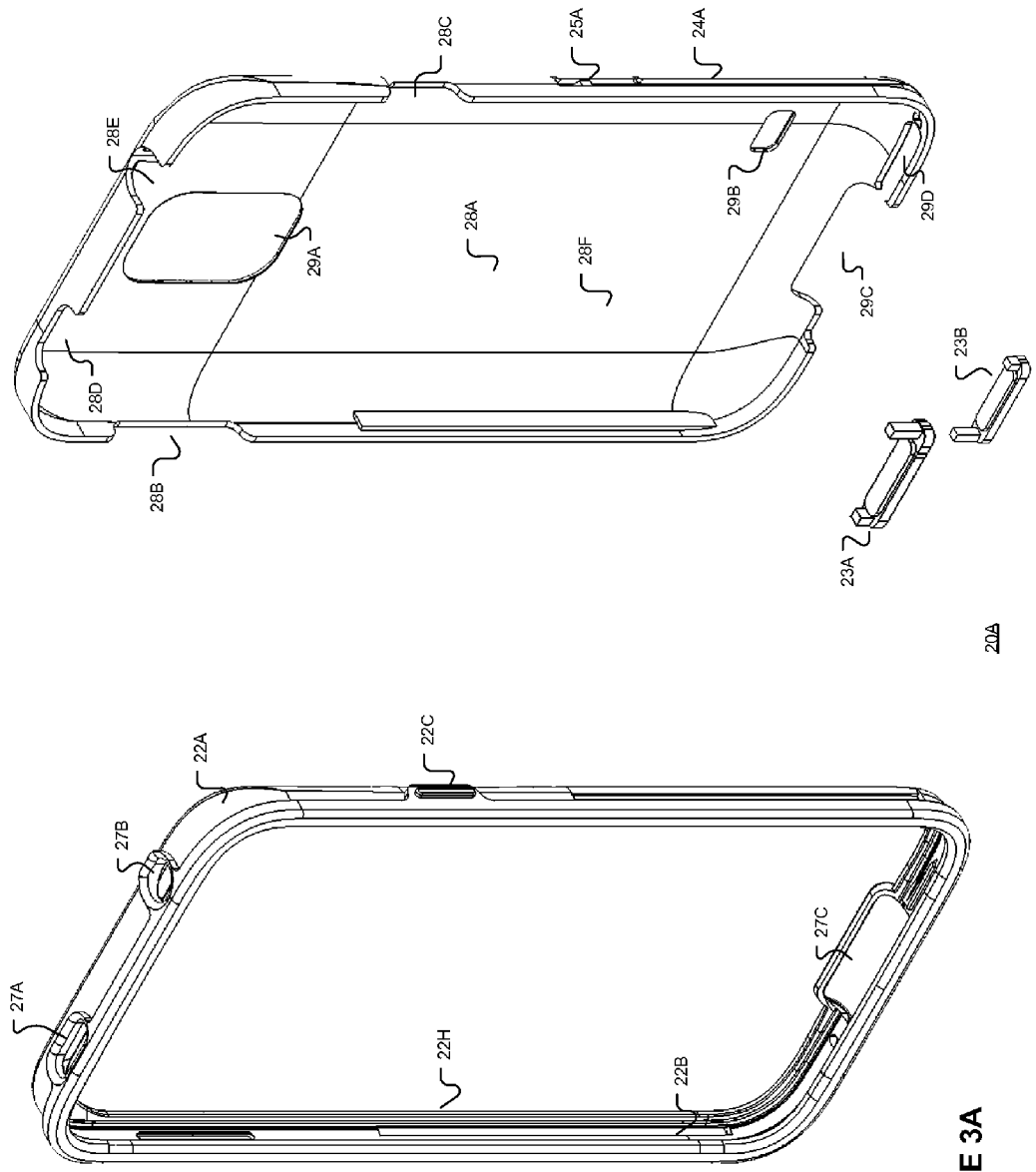
FIG. 3A is a simplified, expanded, isometric diagram of a multicomponent powered PED attachment (MPPA) first component (C1) elements or modules according to various embodiments.

FIG. 3A is a simplified, expanded, isometric diagram of a multicomponent powered PED attachment (MPPA) 5A first component (C1) 20A modules 22A and 211A according to various embodiments. As shown in FIG. 3A, the C1 20A module 22A may include a front lip 22B, a first electronic device button extension 22C, a rear extension 22H, an upper, left opening 27A, an upper, right opening 27B, and a lower, middle opening 27C. The C1 20A module 211A may include a left side upper, button opening 211B, a right side, upper button opening 211C, rail depression 24A, rail extension 25A, upper rear opening 29A in the inner back 28F, lower, right opening 29B, bottom middle opening 29C, bottom right opening 29D, first nestable cover section 23A and second nestable cover section 23B. The first cover section 23A may be sized and shaped to engage the openings 29C and 27C. The second cover section 23B may be sized and shaped to engage the opening 29D. The module 22A rear extension 22H may conform and engage the module 211A outer back 28G. The button covers 22C (and 22E shown in FIG. 3D) may be co-aligned with module 211A button openings 211C, 211B, respectively when the module 211A is coupled to the module 22A (see FIG. 2A). Similarly, the opening 27C may be co-aligned with the opening 29C when the module 211A is coupled to the module 22A.

FIG. 3B is a simplified front diagram and FIG. 3C is a simplified rear diagram of a multicomponent powered PED attachment (MPPA) 5A first component (C1) 20A according to various embodiments. As shown in FIGS. 3B and 3C, the C1 20A may have an inner back 28F, outer back 28G, a left side 28H, a right side 28I, a left side, upper button extension 22E, a right side, upper button extension 22C, device element openings 29A and 29B, and nestable cover sections 23A and 23B. FIG. 3D is a simplified left side diagram and FIG. 3E is a simplified right side diagram of a multicomponent powered PED attachment (MPPA) 5A first component (C1) 20A according to various embodiments. As shown in FIGS. 3D and 3E, the C1 20A may include a rail depression 24A and a rail extension 25A on the right side 28I and a rail depression 24B and a rail extension 25B on the left side 28H. FIG. 3F is a simplified top diagram and FIG. 3G is a simplified bottom diagram of a multicomponent powered PED attachment (MPPA) 5A first component (C1) 20A according to various embodiments. As shown in FIGS. 3F and 3G, the device button extensions 22C and 22E may extend beyond the sides 28H, 28I. Such extensions may enable a user to tactically locate the buttons.

FIG. 3H is a simplified, enlarged, partial isometric diagram and FIG. 3I is a simplified, further enlarged, partial isometric diagram of a multicomponent powered PED attachment (MPPA) 5A first component (C1) 20A according to various embodiments. As shown in FIGS. 3H and 3I, a rail extension 25A may include an upper rail indentation 25C, a lower rail indentation 25D, and a hollowed, compressible section 25E. The rail extension 25A elements 25C, 25D, and 25E may enable the corresponding rail notch 15A (FIG. 4A) to compress and nest with the rail extension 25A.

FIG. 4A is a simplified front diagram and FIG. 4B is a simplified rear diagram of a multicomponent powered PED attachment (MPPA) 5A second, powered component (C2) 10A according to various embodiments. As shown in FIGS. 4A and 4B the MPPA 5A C2 10A may include a right shoulder 12A, a left shoulder 12B, a base 12C, an inner, back 12D, an outer, back 12F, a top edge 12E, a left rail 14B, a left rail notch 15B, a right rail 14A, a right rail notch 15A, a power/data module 110A, and device openings 17A, 17B, 17C. FIG. 4C is a simplified left side diagram and FIG. 4D is a simplified right side diagram of a multicomponent powered PED attachment (MPPA) 5A second, powered component (C2) 10A according to various embodiments. As shown in FIGS. 4C and 4D, the right shoulder 12A and the left shoulder 12B reduce inwardly to the outer, back 12F at the top 12E. As noted, the shoulder reductions may expose upper, side sections of the MPPA 5A C1 20A.

FIG. 4E is a simplified top diagram and FIG. 4F is a simplified bottom diagram of a multicomponent powered PED attachment (MPPA) 5A second, powered component (C2) 10A according to various embodiments. As shown in FIG. 4F, the C2 10A base 12C may include an opening 12G that enables a connector to couple to a power/data module 110A, 110B, and 110D external power interface 16E. FIG. 4G is a simplified, enlarged, partial isometric diagram and FIG. 4H is a simplified, further enlarged, partial isometric diagram of a multicomponent powered PED attachment (MPPA) 5A second, powered component (C2) 10A according to various embodiments. As shown in FIGS. 4G and 4H, a rail 14B notch 15B may include a sloped rail entrance 15C and a rail indention 15D. The sloped rail entrance 15C may ease a rail 14A, 14B into a corresponding rail insert 24A, 24B.

FIG. 5A is a simplified front diagram and FIG. 5B is a simplified rear diagram of a multicomponent powered PED attachment (MPPA) 5A first component (C1) 20A first module 22A according to various embodiments. FIG. 5C is a simplified left side diagram and FIG. 5D is a simplified right side diagram of a multicomponent powered PED attachment (MPPA) 5A first component (C1) 20A first module 22A according to various embodiments. FIG. 5E is a simplified top diagram and FIG. 5F is a simplified bottom diagram of a multicomponent powered PED attachment (MPPA) 5A first component (C1) first module 22A according to various embodiments. As shown in FIGS. 5A-5F, the module 22A may include a right rail opening 22D, a left rail opening 22D, a top section 22F, a bottom section 22G, and a device openings 27A, 27B, and 27C.

FIG. 6A is a simplified front diagram and FIG. 6B is a simplified rear diagram of a multicomponent powered PED attachment (MPPA) 5A first component (C1) 20A second module 211A according to various embodiments. FIG. 6C is a simplified left side diagram and FIG. 6D is a simplified right side diagram of a multicomponent powered PED attachment (MPPA) 5A first component (C1) 20A second module 211A according to various embodiments. FIG. 6E is a simplified top diagram and FIG. 6F is a simplified bottom diagram of a multicomponent powered PED attachment (MPPA) 5A first component (C1) second module 211A according to various embodiments. As shown in FIGS. 6A-6F, the module 211A may include a right rail indentation or insert 24A, a left rail indentation or insert 24B, a right side 28I, a left side 28H, and inner, back 28F, and outer, back 28G, and device openings 29A, 29B, and 29C.

Figure 7A:
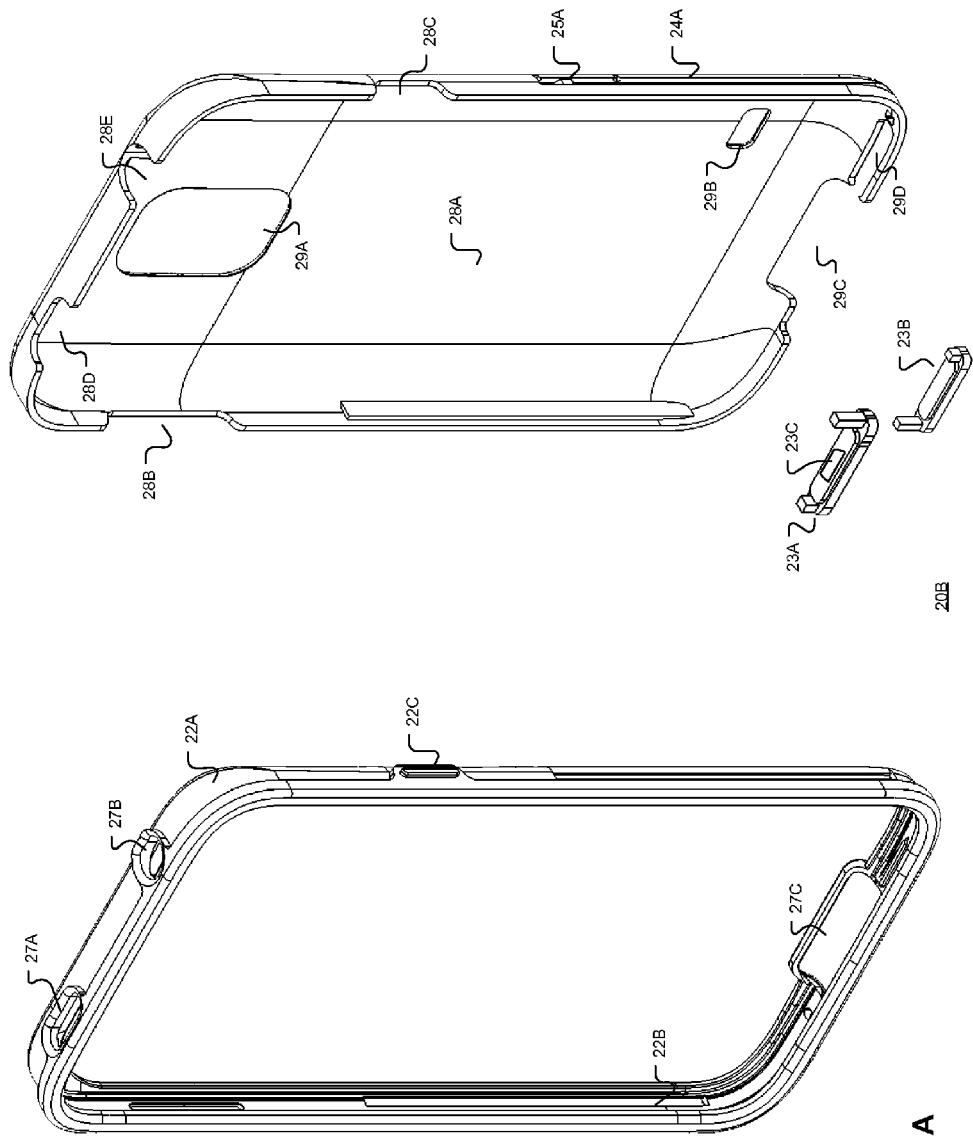
FIG. 7A is a simplified, expanded, isometric diagram of another multicomponent powered PED attachment (MPPA) first component (C1) modules according to various embodiments.

FIG. 7A is a simplified, expanded, isometric diagram of a multicomponent powered PED attachment (MPPA) 5B first component (C1) 20B modules 22A and 211A according to various embodiments. As shown in FIG. 7A, the C1 20B module 22A may include a front lip 22B, a first electronic device button extension 22C, a rear extension 22H, an upper, left opening 27A, an upper, right opening 27B, and a lower, middle opening 27C. The C1 20B module 211A may include a left side upper, button opening 211B, a right side, upper button opening 211C, rail depression 24A, rail extension 25A, upper rear opening 29A in the inner back 28F, lower, right opening 29B, bottom middle opening 29C, bottom right opening 29D, first nestable cover section 23A and second nestable cover section 23B. The first cover section 23A may be sized and shaped to engage the openings 29C and 27C. The second cover section 23B may be sized and shaped to engage the opening 29D. The module 22A rear extension 22H may conform and engage the module 211A outer back 28G. The first nestable cover section 23A may include an opening 23C sized to enable the electronic interface connector 13A to pass into a portable electronic device (PED) 30A connector 32G.

Figure 7B:
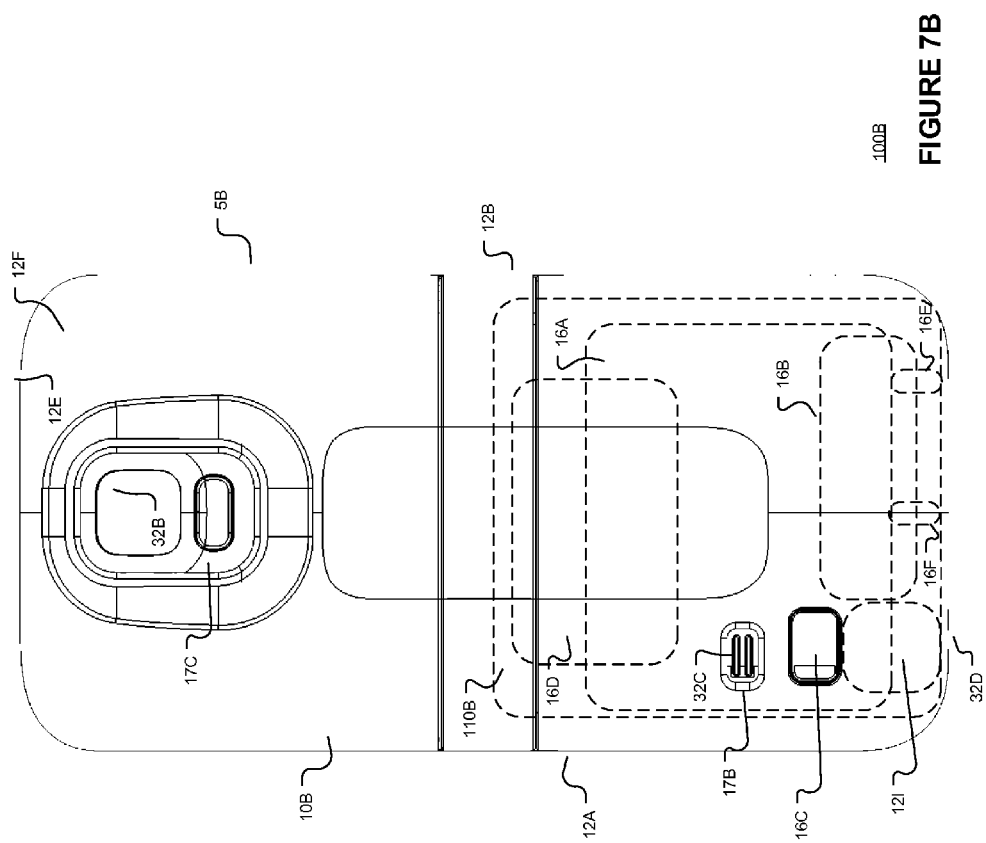
FIG. 7B is a simplified rear diagram of another multicomponent powered PED attachment (MPPA) with a first component (C1) coupled to a portable electronic device (PED) and fully advanced toward a second, powered component (C2) according to various embodiments.

FIG. 7B is a simplified rear diagram of architecture 100B including a multicomponent powered PED attachment (MPPA) 5B with a first component (C1) 20B coupled to a portable electronic device (PED) 30A and fully advanced and coupled with a second, powered component (C2) 10B according to various embodiments. As shown in FIG. 7B, the C2 10B has a plurality of openings or fenestrations 17A and 17B that may correspond to one or more electronic device 30A components including a camera 32B and a near field communication module 32C. As also shown in FIG.

7B, the second component 10B may include a power/data module 110B. As shown in FIG. 7B and FIG. 11B, the power/data module 110B may include an electrical energy storage module 16A, a control module 16B, a user control-display module 16C, an inductive charging module 16D, an external power interface 16E, and a portable electronic device (PED) interface 16F. The power/data module 110B may provide power to a portable electronic device (PED) 30A via induction (via the induction module 16D) or the electronic device interface 16F. The power/data module 110B may receive electrical energy via induction (the induction module 16D) or directly via the external power interface module 16E.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion. The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Figure 8B:
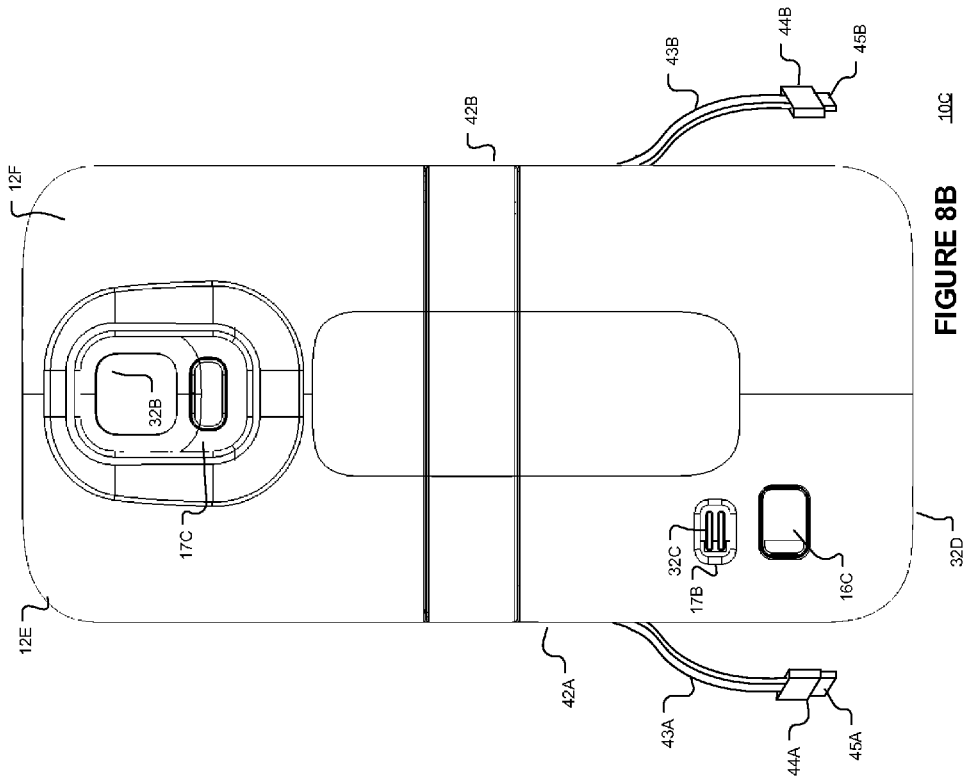
FIG. 8B is a simplified rear diagram of a multicomponent powered PED attachment (MPPA) PED bottom mount second, powered component (C2) with multiple deployed power connectors according to various embodiments.
Figure 8A:
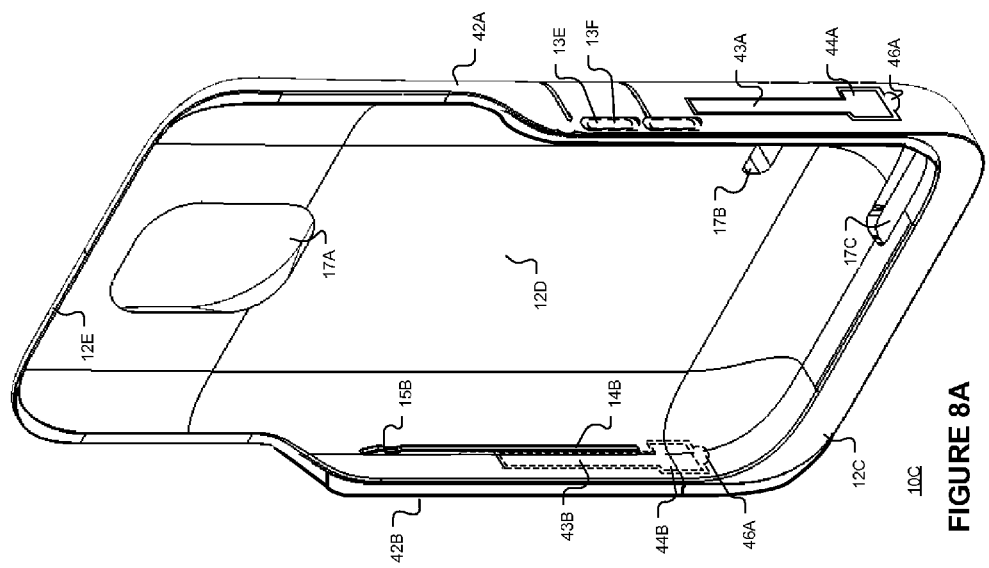
FIG. 8A is a simplified isometric diagram of a multicomponent powered PED attachment (MPPA) PED bottom mount second, powered component (C2) with multiple deployable power connectors according to various embodiments.

For example, a second component C2 may be slidably engaged with a first component C1 via the first component C1 left side, right side, top, bottom and along the C1 front or rear. In another embodiment, a MPPA system may include a single component 10N that may be slidably engaged with a PED 30A via the PED 30A left side, right side, top, bottom and along the PED 30A front or rear. FIG. 8A is a simplified isometric diagram of a multicomponent powered PED attachment (MPPA) system PED bottom mounted second, powered component (C2) 10C with multiple deployable power electrical connectors 44A, 44B according to various embodiments. FIG. 8B is a simplified rear diagram of a multicomponent powered PED attachment (MPPA) system PED bottom mounted second, powered component (C2) 10C with multiple deployed power electrical connectors 44A, 44B according to various embodiments.

As shown in FIG. 8A, the second component (C2) 10C may include several contacts 13E with protruding or depressible sections 13F sized and located on the C2 10C inner shoulder 12A, 12B to engage and electrical couple the contacts 13C of a first component C1 20E (FIG. 2E) when the C1 20E is coupled to the C2 10C. The electrical contacts 13C, 13E may couple an electronic device 30A to the C2 10C when the C2 10C is slidably coupled to the C1 20E. The contacts 13C, 13E may communicate power and data between components C1 20E, C2 10C, and a coupled electronic device 30A.

As also shown in FIG. 8A, a C2 of MPPA system 5A may include a deployable electrical connectors 44A, 44B in side arms 42A, 42B, respectively. As also shown in FIG. 8A, each electrical connector 44A, 44B may be coupled to the C2 10C power/data module 110A-110D in part via the flexible 43A, 43B. Each side arm 42A, 42B may include a recess 46A, 46B that may enable each electrical connector 44A, 44B and flexible cable 43A, 43B to be securely recessed within an arm 42A, 42B when not deployed. As shown in FIG. 8B, an electrical connector 44A, 44B may have a mechanical-electrical interface 45A, 45B with multiple electrical contacts. The mechanical-electrical interface 45A, 45B may be sized and the contacts located and configured to conform with one or more standards or a device specific interface including Universal serial bus (USB) configuration, Apple® connectors, and other formats. In an embodiment, an electrical connector 44A, 44B may communicate data and power with two or more contacts. A power/data module 110D may include a memory module 12I. The memory module 12I may include an internal volatile or non-volatile memory and a data memory storage interface ("DMSI") module 12J.

The data memory storage interface ("DMSI") module 12J may interface with one or more memory devices including a compact flash card, secure digital (SD), miniSD, microSD, SD high capacity (SDHC), miniSDHC, microSDHC, SD extended capacity, and memory stick. The DMSI 12J may conform to the SD input-output (SDIO) standard to enable a data memory card and other devices to communicate electronic data with a PED via a power/data module 110D and connector 44A-44D, 13A.

A MPPA system 5A via connectors 44A, 44B may communicate power or electrical energy between an energy module 16A EESE 16G and the PED 30A or other PEDs. A connector 44A, 44B may provide electrical energy from an energy module 16A EESE 16G to an electrically coupled PED. In an embodiment, a connector 44A, 44B may also receive electrical energy from an electrically coupled PED. In a further embodiment, a first connector 44A may only provide electrical energy from an energy module 16A EESE 16G to an electrically coupled PED and a second connector 44B may only receive electrical energy from an electrically coupled PED. The second component C2 10C may also communicate electrical energy inductively with a PED 30A via an induction module 16D.

Figure 8D:
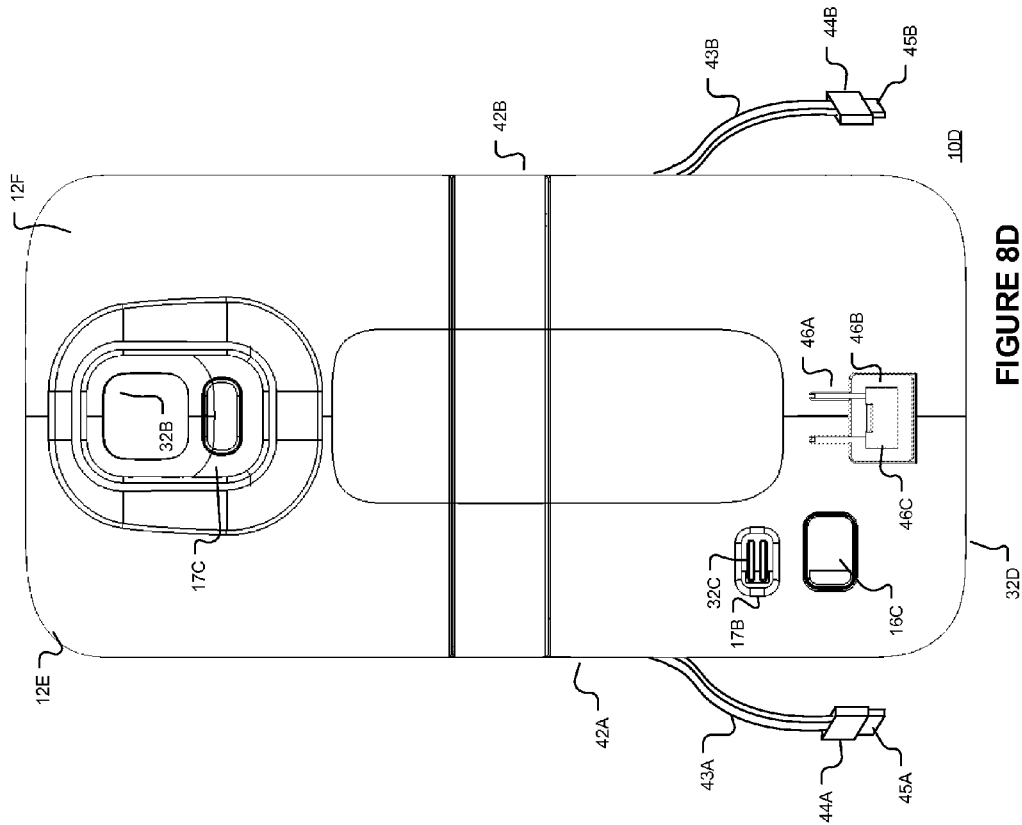
FIG. 8D is a simplified rear diagram of a multicomponent powered PED attachment (MPPA) PED bottom mount second, powered component (C2) with multiple deployed power connectors and a deployable AC power source interface according to various embodiments.
Figure 8C:
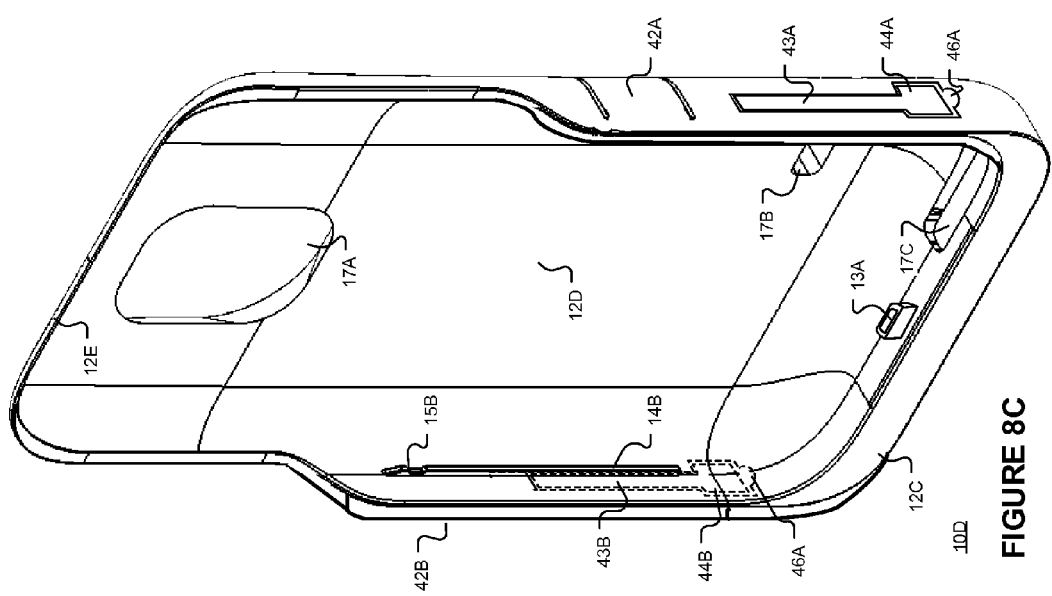
FIG. 8C is a simplified isometric diagram of a multicomponent powered PED attachment (MPPA) PED bottom mount second, powered component (C2) with multiple deployable power connectors and a fixed PED connector according to various embodiments.

FIG. 8C is a simplified isometric diagram of another multicomponent powered PED attachment (MPPA) system PED bottom mounted second, powered component (C2) 10D with multiple deployable power electrical connectors 44A, 44B and electronic interface connector 13A according to various embodiments. FIG. 8D is a simplified rear diagram of a multicomponent powered PED attachment (MPPA) system PED bottom mounted second, powered component (C2) 10D with multiple deployed power electrical connectors 44A, 44B and a deployable alternating current power interface 46B according to various embodiments. As noted, a connector 13A may be placed to align a corresponding PED 30A electronic interface module 32G when the PED 30A is coupled to the C2 10D.

The deployable alternating current (AC) power interface 46B may include prongs 46A and a rotatable base 46C that is recessed within the second component (C2) 10D when not deployed. The power/data module 110D may include a transformer/converter module 16H that receives alternating current signals and generates direct current (DC) signals having a voltage and current level usable by the control module 16B and PEDs 30A. In an embodiment, different electrical interfaces 44A-D, 13A may provide DC signals with different voltage and current levels or programmable voltage and current levels. A user via the user control 16C may be able to program the DC voltage and current levels in an embodiment. The control module 16B may receive power from the transformer/converter module 16H and be able to provide power to multiple PEDs via connectors 44A-D, 13A and provide energy to the energy module 16A. The control module 16B may receive power from connectors 44A-D, 13A and provide power to multiple PEDs via the other connectors 44A-D, 13A and provide energy to the energy module 16A. The energy module 16A may charge the EESE 16G when sufficient power is provided by the control module 16B.

In an embodiment, the transformer/converter module 16H may include a buck converter. The buck converter may include a switch, a diode or second switch, inductor, capacitor, and resistor. The duty cycle of the switch(es) may control the resultant DC signal generated by the buck converter from a received AC signal. The transformer/inverter may also include a plurality of diodes to form a diode bridge to rectify the AC signal and an inductor to smooth the resultant rectified signal to generate a DC signal. The resultant DC signal may be coupled to a transformer to reduce the voltage level based on the respective in and out windings of the transformer.

In an embodiment, the elements 16A-F, 16H, and 12I of power/data module 110D or other modules 110A-C may also be formed in an integrated circuit or application specific integrated circuit.

Figure 9B:
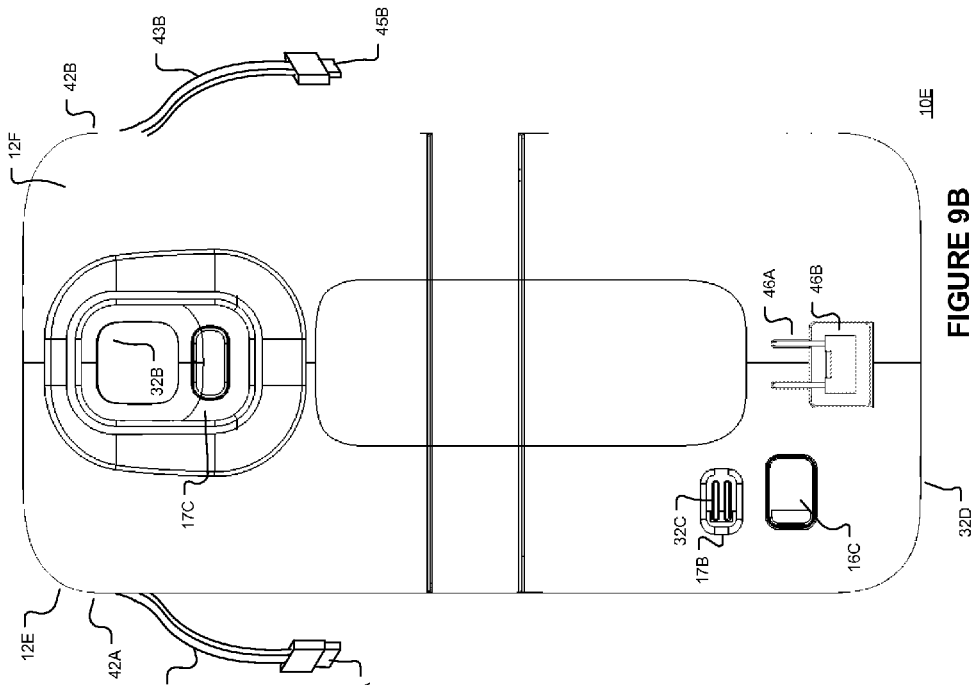
FIG. 9B is a simplified rear diagram of a multicomponent powered PED attachment (MPPA) PED top mount second, powered component (C2) with multiple deployed power connectors and a deployable AC power source interface according to various embodiments.
Figure 9A:
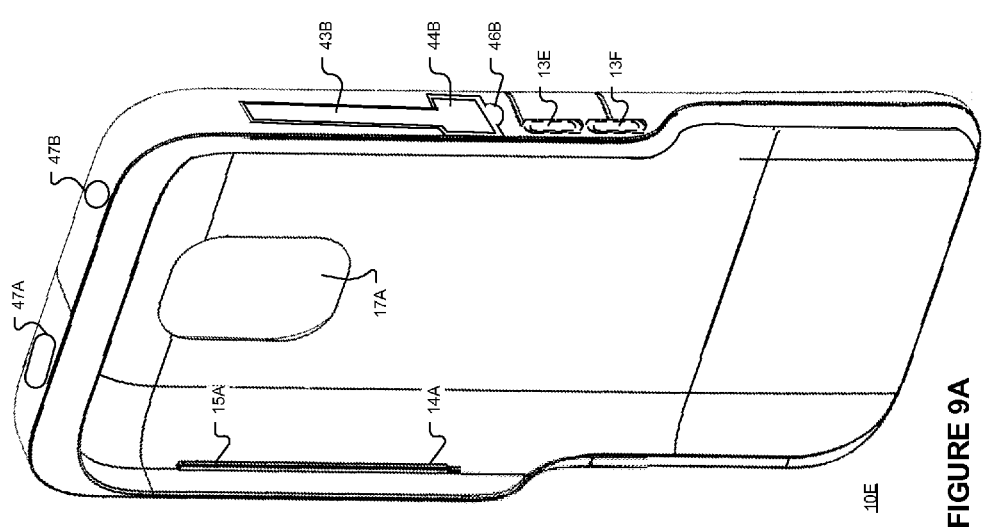
FIG. 9A is a simplified isometric diagram of a multicomponent powered PED attachment (MPPA) PED top mount second, powered component (C2) with multiple deployable power connectors according to various embodiments.

FIG. 9A is a simplified isometric diagram of a multicomponent powered PED attachment (MPPA) system PED top mounted second, powered component (C2) 10E with multiple deployable power electrical connectors 44A, 44B according to various embodiments. FIG. 9B is a simplified rear diagram of a multicomponent powered PED attachment (MPPA) system PED top mounted second, powered component (C2) 10E with multiple deployed power electrical connectors 44A, 44B according to various embodiments. FIG. 9C is a simplified right side diagram of a multicomponent powered PED attachment (MPPA) system PED top mounted second, powered component (C2) 10E with multiple deployed power electrical connectors 44A, 44B according to various embodiments.

Figure 9D:
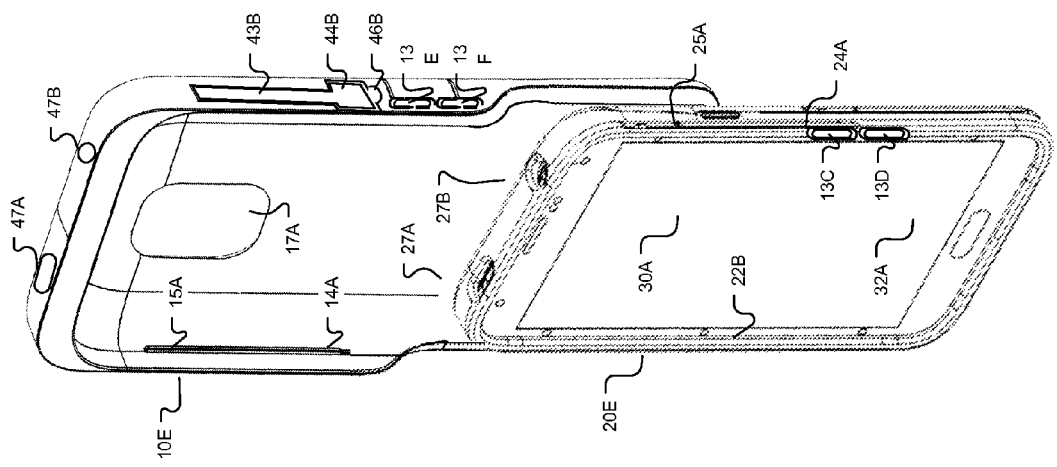
FIG. 9D is a simplified isometric diagram of a multicomponent powered PED attachment (MPPA) with a first component (C1) coupled to a portable electronic device (PED) and being slidably coupled toward a PED top mount second, powered component (C2) according to various embodiments.
Figure 9C:
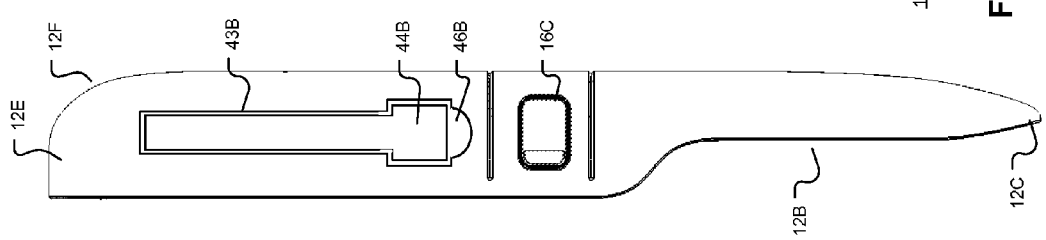
FIG. 9C is a simplified side diagram of a multicomponent powered PED attachment (MPPA) PED top mount second, powered component (C2) with a deployable power connector according to various embodiments.

As shown in FIG. 9A and FIG. 9D, the second component (C2) 10E may include several contacts 13E with protruding or depressible sections 13F sized and located on the C2 10E inner shoulder 12A, 12B to engage and electrical couple the contacts 13C of a first component C1 20E (FIG. 2E) when the C1 20E is coupled to the C2 10E. The electrical contacts 13C, 13E may couple an electronic device 30A (coupled to the C1 20E) to the C2 10E when the C2 10E is slidably coupled to the C1 20E. The contacts 13C, 13E may communicate power and data between components C1 20E, C2 10E, and a coupled electronic device 30A.

As also shown in FIGS. 9A, 9B, and 9C, the top mounted second component 10E may have rails 14A, 14B located in top inside of the component 10E. The component 10E upper section may have several PED 30A openings including a camera opening 17A, power switch opening 47A, and speaker port opening 47B. The top mounted second component 10E may have a user control switch and indicator 16C on its side and rear section in an embodiment. The user control switch and indicator 16C may enable a user to control the operation of the C2 10E including EESE 16G charge and discharge operation and an indication of its charge state. The indicator 16C may include a plurality of LEDs to indicate the charge or capacity of an EESE 16G. The LEDs or other user perceptible indicator may use different color lights or different frequency sounds or patterns to indicate EESE 16H capacity.

Figure 10B:
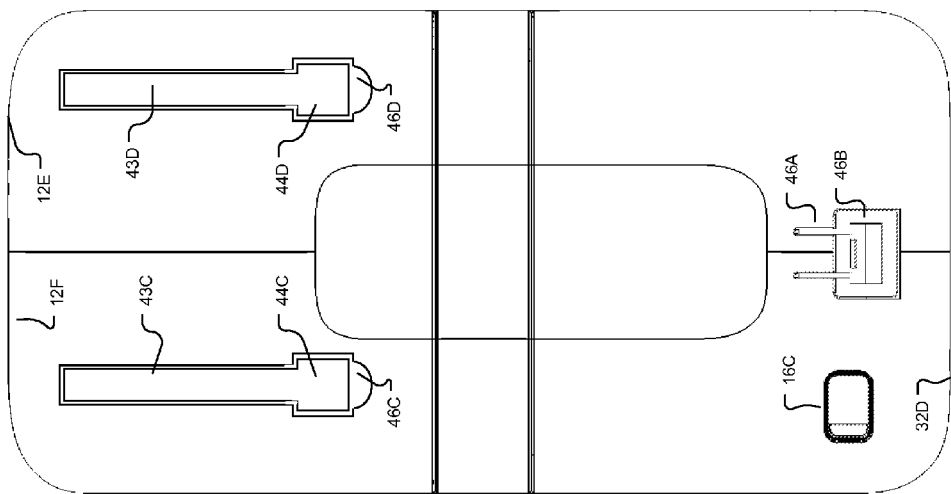
FIG. 10B is a simplified rear diagram of a multicomponent powered PED attachment (MPPA) PED top or bottom mounted second, powered component (C2) with multiple deployable rear based power connectors and a deployable AC power source interface according to various embodiments.
Figure 10A:
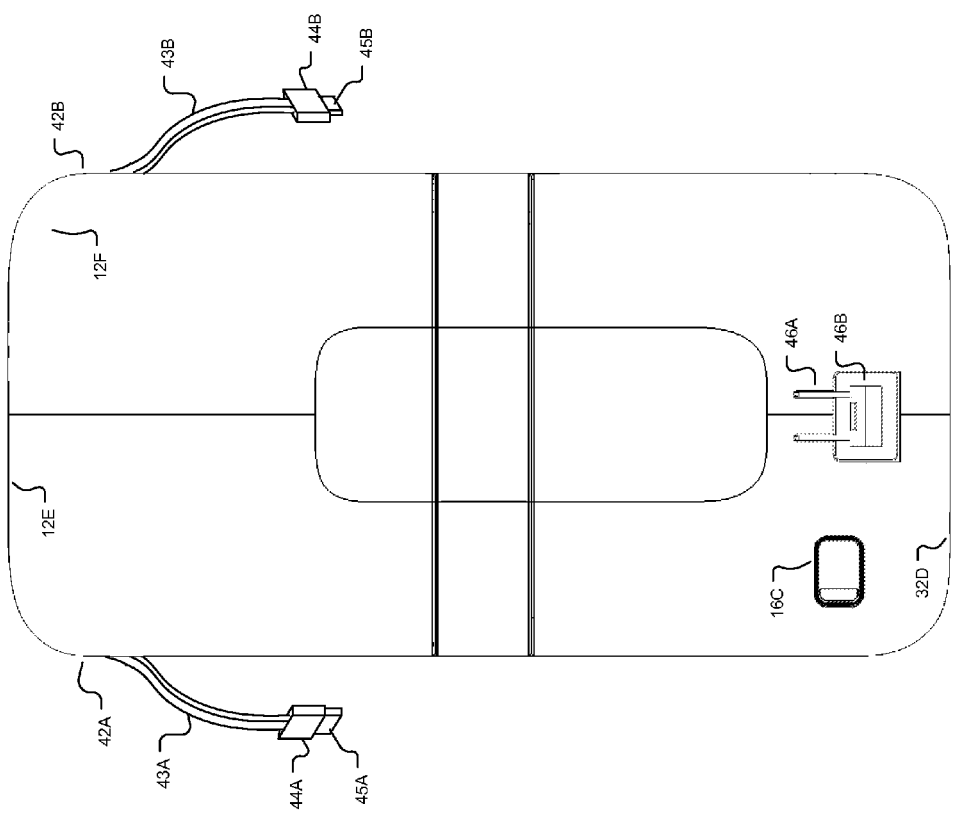
FIG. 10A is a simplified rear diagram of a multicomponent powered PED attachment (MPPA) PED top or bottom mounted second, powered component (C2) with multiple deployed side based power connectors and a deployable AC power source interface according to various embodiments.

FIG. 9D is a simplified isometric diagram of a multicomponent powered PED attachment (MPPA) with a first component (C1) 20B coupled to a portable electronic device (PED) 30A and being slidably coupled toward the top of a second, powered component (C2) 10E according to various embodiments. As shown in FIG. 9D, the inserts 24A, 24B and detents 25A, 25B may also be moved to a higher section of the C1 20B sides to engage the corresponding rails 14A, 14B and notches 15A, 15B of the top mounted C2 10E. FIG. 10A is a simplified rear diagram of a multicomponent powered PED attachment (MPPA) system 5A, 5B PED second, powered component (C2) 10F with multiple deployed side based power connectors 44A, 44B and a deployable AC power source interface 46B according to various embodiments.

As shown in FIG. 10A, the C2 10A may not include PED element openings 17A and 17B. The C2 10A may be mountable from the top or bottom of a C1 20A, 20B. FIG. 10B is a simplified rear diagram of a multicomponent powered PED attachment (MPPA) system 5A, 5B PED second, powered component (C2) 10G with multiple deployable rear based power connectors 44C, 44D and a deployable AC power source interface 46B according to various embodiments. As shown in FIG. 10B, the electrical connectors 44C, 44D may be coupled to flexible cables 43C, 43D, respectively. The C2 10G rear section may include recesses 46C, 46D that may securely hold the electrical connectors 44C, 44D and cables 43C, 43D when not deployed. Similar to C2 10F of FIG. 10A, the C2 10B may not include PED element openings 17A and 17B and may be mountable from the top or bottom of a C1 20A, 20B.

Figure 10C:
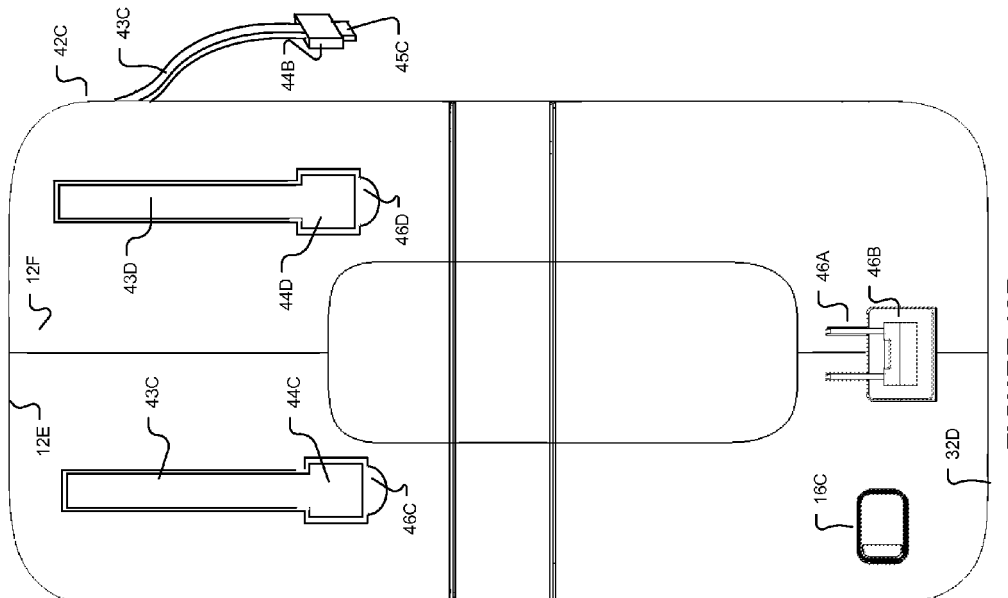
FIG. 10C is a simplified rear diagram of a multicomponent powered PED attachment (MPPA) PED top or bottom mounted second, powered component (C2) with multiple deployed side based power connectors, a deployable rear connector, and a deployable AC power source interface according to various embodiments.
Figure 10D:
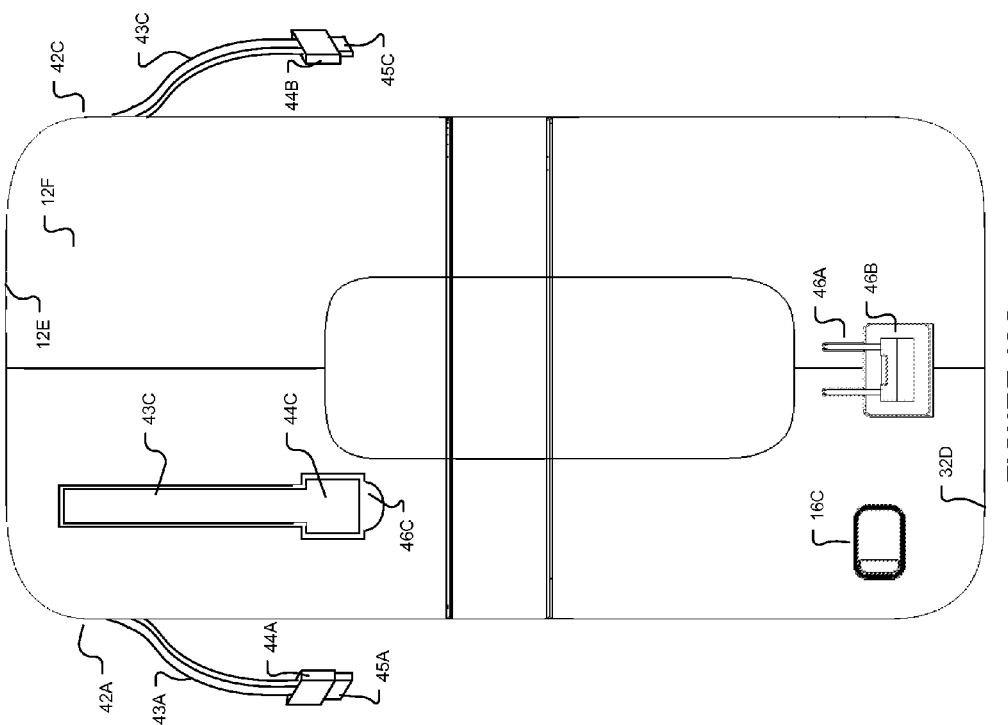
FIG. 10D is a simplified rear diagram of a multicomponent powered PED attachment (MPPA) PED top or bottom mounted second, powered component (C2) with multiple deployed side based power connectors, two deployable rear connectors, and a deployable AC power source interface according to various embodiments.

FIG. 10C is a simplified rear diagram of a multicomponent powered PED attachment (MPPA) PED system 5A, 5B second, powered component (C2) 10H with multiple deployed side based power connectors 44C, 44D, a deployable rear connector 44C, and a deployable AC power source interface 46B according to various embodiments. FIG. 10D is a simplified rear diagram of a multicomponent powered PED attachment (MPPA) PED system 5A, 5B second, powered component (C2) 10I with multiple deployed side based power connectors 44C, 44D, multiple deployable rear connectors 44C, 44D, and a deployable AC power source interface 46B according to various embodiments. Similar to C2 10F, 10G of FIGS. 10A and 10B, the C2 10H, 10I of FIGS. 10C, 10D may not include PED element openings 17A and 17B and may be mountable from the top or bottom of a C1 20A, 20B.

FIG. 10E is a simplified side diagram of a multicomponent powered PED attachment (MPPA) system 5A, 5B PED second, powered component (C2) 10J with multiple deployable electrical connectors 44B, 44E on a single side according to various embodiments. The C2 10J may have a continuous side with two sets of rails to mate with a C1 20A or 20B as a bottom mount or a top mount second component. In an embodiment, the C2 10J may not have any rails and may be sized to slidably engage side edges of PED 30A. FIG. 10F is a simplified side diagram of a multicomponent powered PED attachment (MPPA) system 5A, 5B PED second, powered component (C2) 10K with multiple deployable electrical connectors 44B, 44E on a single side and an enlarged cavity according to various embodiments. The C2 10K may also have a continuous side with two sets of rails to mate with a C1 20A or 20B as a bottom mount or a top mount second component. In an embodiment, the C2 10J may not have any rails and may be sized to slidably engage side edges of PED 30A. In an embodiment, a C1 20A, 20B may also include two sets of inserts and detents to enable a corresponding two railed C2 10J, 10K to be moved from the top or bottom of the C1 20A, 20B and the mated PED 30A.

It is noted that the EESE 16G may have various storage capacities, measured in milli-ampere hours (mAh). Depending on the side width and height of the C2 10A-10Q, a C2 10A-10Q EESE 16G may have a 1000 to 15000 mAh capacity in an embodiment. FIG. 10G is a simplified top diagram of a multicomponent powered PED attachment (NIPPA) system 5B PED top mounted second, powered component (C2) 10L with multiple electrical connectors 12H, 12G and a memory card interface 12J according to various embodiments. As shown in FIG. 10G, the C2 10L may also include PED 30A element openings 47A and 47B in an embodiment. In an embodiment, the electrical connectors 12H, 12G may be female connectors having a mechanical or electrical contact shaped, sized, and located to conform to one or more standards including USB, Apple, or other device specific configurations. A connectors 12H, 12G may be able to communicate electrical energy with a PED 30A and the energy module 16A EESE 16G. In an embodiment, a connector 12H or 12G may only provide electrical energy from an energy module 16A EESE 16G to an electronic device via a user supplied cable. In an embodiment, a connector 12H or 12G may only receive electrical energy via a PED or other power source coupled to the connector 12H or 12G by a cable.

Figure 10J:
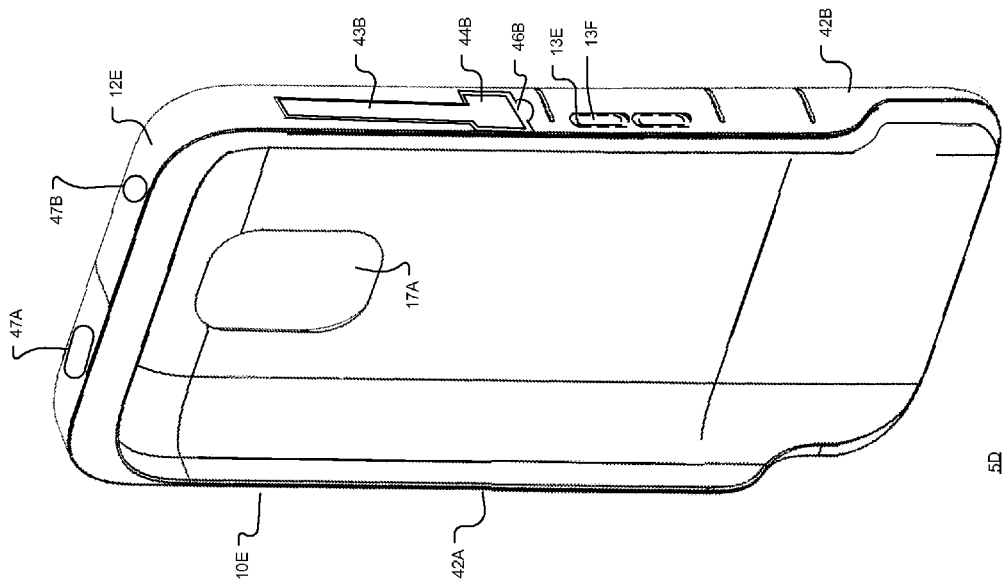
FIG. 10J is a simplified isometric diagram of a single component powered PED attachment (MPPA) PED top mount apparatus with multiple deployable power connectors according to various embodiments.
Figure 10I:
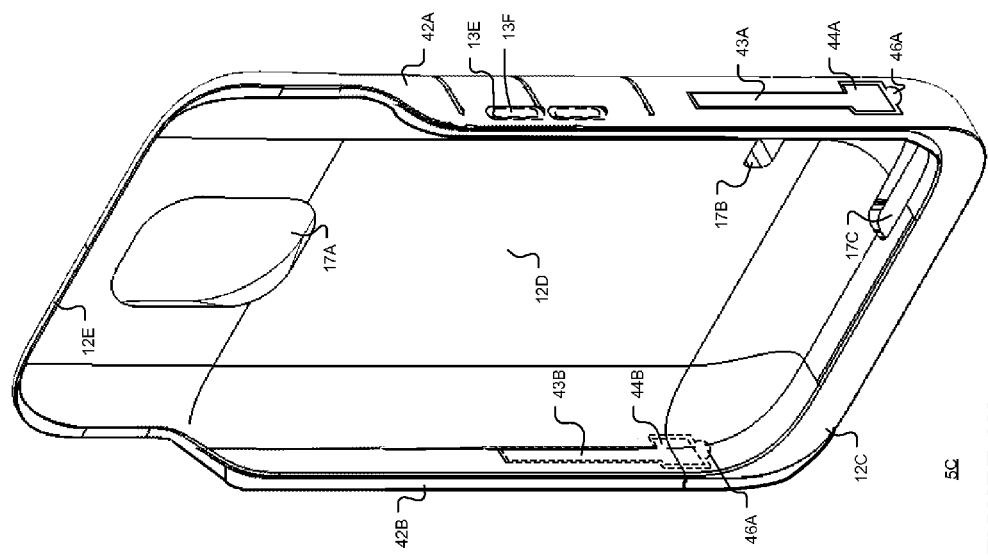
FIG. 10I is a simplified isometric diagram of a single component powered PED attachment (MPPA) PED bottom mount apparatus with multiple deployable power connectors according to various embodiments.

FIG. 10H is a simplified top or bottom diagram of a multicomponent powered PED attachment (MPPA) system 5A, 5B PED top or bottom mounted second, powered component (C2) 10M with multiple electrical connectors 12H, 12G and a memory card interface 12J according to various embodiments. The C2 top or bottom configuration 10M may employed with a C2 having full sides 10J, 10K as shown in FIGS. 10E, 10F and C2 10F-I of FIGS. 10A-C, and C2. In an embodiment, a powered PED system 5C-5F may not require an inner component C1 or an inner component C1 with rails as shown in FIGS. 10I-10L. FIG. 10I is a simplified isometric diagram of a powered PED attachment (PPA) PED bottom mount system 5C with multiple deployable power connectors according to various embodiments.

As shown in FIG. 10I, the system 5C may include several contacts 13E with protruding or depressible sections 13F sized and located on the system 5C inner shoulder 12A, 12B to engage and electrical couple the contacts 13C of a first component C1 20E (FIG. 2E) when the C1 20E is coupled to the system 5C in an embodiment. The electrical contacts 13C, 13E may couple an electronic device 30A (coupled to the C1 20E) to the system 5C when the system 5C is slidably coupled to the C1 20E. The contacts 13C, 13E may communicate power and data between components C1 20E, system 5C, and a coupled electronic device 30A in an embodiment where the system 5C is configured to receive the first component C1 20E.

As also shown in FIG. 10I, the PPA system 5C includes longer sides 42A, 42B and PED 30A element openings 17A, 17B and 17C. The sides 42A, 42B may include recessed, deployable electrical connectors 44A, 44B. In an embodiment, the system 5C may be sized to engage a PED 30A sides and may securely engage a PED 30A via the distance between the sides 42A, 42B, length of the sides 42A, 42B, and base 12C. The system 5C may be slid over the base and rear of a PED 30A. In an embodiment, the system 5C may also include an electronic interface connector 13A in the base 12C to mechanically and electrically coupled with a corresponding connector 32A in the base of the PED 30A. In a further embodiment, a non-railed C1 20A, 20B may be coupled to a PED 30A and the system 5C may be slidably coupled a PED 30A via the non-railed C1 20A, 20B. FIG. 10J is a simplified isometric diagram of a powered PED attachment (PPA) PED top mount system 5D with multiple deployable power connectors according to various embodiments.

As shown in FIG. 10J, the system 5D may include several contacts 13E with protruding or depressible sections 13F sized and located on the system 5D inner shoulder 12A, 12B to engage and electrical couple the contacts 13C of a first component C1 20E (FIG. 2E) when the C1 20E is coupled to the system 5D in an embodiment. The electrical contacts 13C, 13E may couple an electronic device 30A (coupled to the C1 20E) to the system 5D when the system 5D is slidably coupled to the C1 20E. The contacts 13C, 13E may communicate power and data between components C1 20E, system 5D, and a coupled electronic device 30A in an embodiment where the system 5D is configured to receive the first component C1 20E.

As also shown in FIG. 10J, the PPA system 5D includes longer sides 42A, 42B and PED 30A element openings 17A, 47A and 47B. The sides 42A, 42B may include recessed, deployable electrical connectors 44A, 44B. In an embodiment, the system 5D may be sized to engage a PED 30A sides and may securely engage a PED 30A via the distance between the sides 42A, 42B, length of the sides 42A, 42B, and top 12E. The system 5D may be slid over the top and rear of a PED 30A. In a further embodiment, a non-railed C1 20A, 20B may be coupled to a PED 30A and the system 5C may be slidably coupled a PED 30A via the non-railed C1 20A, 20B. FIG. 10K is a simplified isometric diagram of a powered PED attachment (PPA) PED top or bottom mounted system 5E with multiple deployable power connectors 44A, 44B, and 44C according to various embodiments.

As shown in FIG. 10K, the system 5E may include several contacts 13E with protruding or depressible sections 13F sized and located on the system 5E inner shoulder 12A, 12B to engage and electrical couple the contacts 13C of a first component C1 20E (FIG. 2E) when the C1 20E is coupled to the system 5E in an embodiment. The electrical contacts 13C, 13E may couple an electronic device 30A (coupled to the C1 20E) to the system 5E when the system 5E is slidably coupled to the C1 20E. The contacts 13C, 13E may communicate power and data between components C1 20E, system 5E, and a coupled electronic device 30A in an embodiment where the system 5E is configured to receive the first component C1 20E.

As also shown in FIG. 10K, the PPA system 5E may include full length sides 42A, 42B and two deployable electrical connectors 44A, 44B, 44C, 44D on each side as shown in FIGS. 10E and 10F. In an embodiment, the system 5E may be sized to engage substantially all of a PED 30A sides and may securely engage a PED 30A via the distance between the sides 42A, 42B and length of the sides 42A, 42B. The system 5D may be slid over the top and rear of a PED 30A or over the base and rear of a PED 30A. In a further embodiment, a non-railed C1 20A, 20B may be coupled to a PED 30A and the system 5C may be slidably coupled a PED 30A via the non-railed C1 20A, 20B by sliding the system 5E over the top and rear of the C1 20A, 20B or over the base and rear of the C1 20A, 20B. In a further embodiment, the system 5E may include rails 14A, 14B on an inner portion of the walls 42B, 42A to slidably engage corresponding inserts 24A, 24B of a C1 20A, 20B.

Figure 10L:
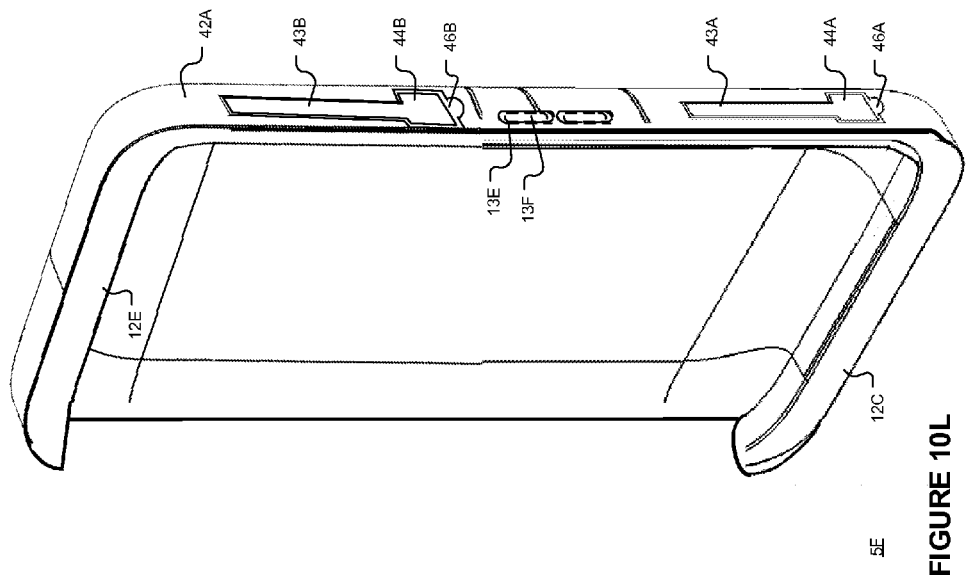
FIG. 10L is a simplified isometric diagram of a single component powered PED attachment (MPPA) PED left or right mount apparatus with multiple deployable power connectors according to various embodiments.
Figure 10K:
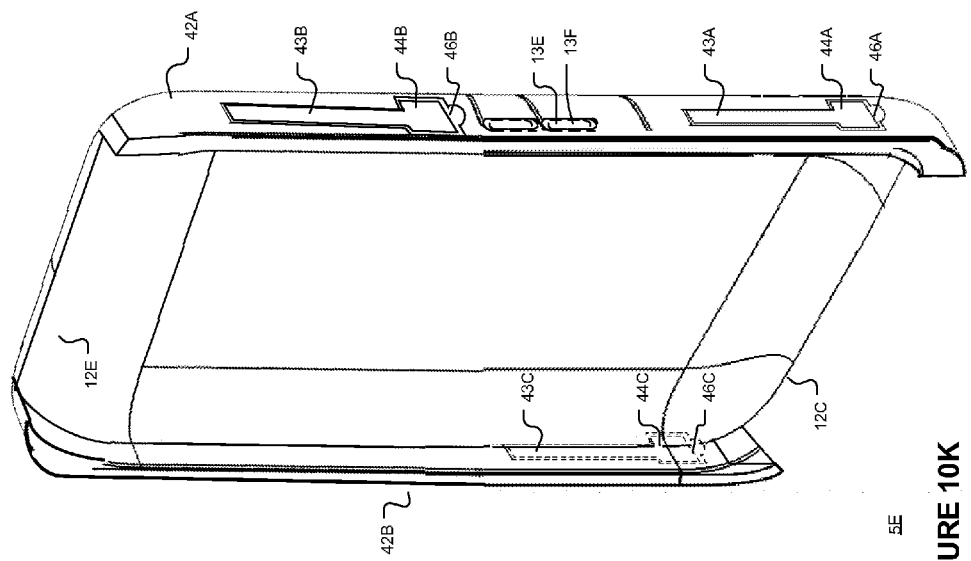
FIG. 10K is a simplified isometric diagram of a single component powered PED attachment (MPPA) PED top or bottom mount apparatus with multiple deployable power connectors according to various embodiments.

FIG. 10L is a simplified isometric diagram of a powered PED attachment (PPA) PED left or right mounted system 5F with multiple deployable power connectors 44A, 44B according to various embodiments. As shown in FIG. 10L, the system 5F may include several contacts 13E with protruding or depressible sections 13F sized and located on the system 5F inner shoulder 12A, 12B to engage and electrical couple the contacts 13C of a first component C1 20E (FIG. 2E) when the C1 20E is coupled to the system 5F in an embodiment. The electrical contacts 13C, 13E may couple an electronic device 30A (coupled to the C1 20E) to the system 5F when the system 5F is slidably coupled to the C1 20E. The contacts 13C, 13E may communicate power and data between components C1 20E, system 5F, and a coupled electronic device 30A in an embodiment where the system 5F is configured to receive the first component C1 20E.

As also shown in FIG. 10K, the PPA system 5F may include a full length top 12E and a full length bottom 12C. In an embodiment, the system 5F may also include a full length side 42A including the two deployable electrical connectors 44A, 44B. In a further embodiment, a system 5F may not include any sides 42A, 42B.

In an embodiment, the system 5F may be sized to engage substantially all of a PED 30A top and base. The system 5F may securely engage a PED 30A via the distance between the top 12E and base 12C and length of the system 5F top 12E and base 12C. The system 5F may be slid over the left side and rear of a PED 30A or over the right side and rear of a PED 30A. In a further embodiment, a non-railed C1 20A, 20B may be coupled to a PED 30A and the system 5C may be slidably coupled a PED 30A via the non-railed C1 20A, 20B by sliding the system 5F over the left side and rear of the C1 20A, 20B or over the right side and rear of the C1 20A, 20B. In a further embodiment, the system 5E may include rails 14A, 14B on an inner portion of the top 12E and base 12C to slidably engage corresponding inserts 24A, 24B on the top and base of a C1 20A, 20B. It is noted that the systems 5A-5F may also include rear deployable electrical connectors 44C, 44D as shown in FIG. 10D in an embodiment.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A multicomponent apparatus for providing power and device perimeter protection for a portable handheld mobile device (PHMD) apparatus including an inductive power interface and an outer perimeter, the multicomponent apparatus including:
   a perimeter protection module (PPM), the perimeter protection module including:
      a frame including one of a left side and a right side and a top side and a bottom side forming an opening that when coupled to a PHMD engages at least 60% of the PHMD corresponding sides, the one of the left and right combination outer left side including one of an elongated rail and slot along at least a portion thereof and the outer right side including one of an elongated rail and slot along at least a portion thereof and the top and bottom combination outer top side including one of an elongated rail and slot along at least a portion thereof and the outer bottom side including one of an elongated rail and slot along at least a portion thereof;
      a back coupled to the frame, the back including a corresponding inductive interface positioned to be operatively adjacent the PHMD inductive power interface; and
      a plurality of PPM electrical contacts on one of the frame, the back, or a combination of the frame and back; and
   a power source module (PSM), the power source module including:
      a shell, the shell including an elongated surface with one of a corresponding combination of an elongated left shoulder and elongated right shoulder on opposite sides of the surface and a corresponding combination of an elongated top extension and elongated bottom extension on opposite sides of the surface, the one of the left and right combination inside surface of the left shoulder including the other of an elongated slot and rail sized to engage at least a portion of the PPM outer left side one of an elongated rail and slot and the inside surface of the right shoulder including the other of an elongated slot and rail sized to engage at least a portion of the PPM outer right side one of an elongated rail and slot and the top and bottom combination inside surface of the top extension including the other of an elongated slot and rail sized to engage at least a portion of the PPM outer top one of an elongated rail and slot and the inside surface of the bottom extension including the other of an elongated slot and rail sized to engage at least a portion of the PPM outer bottom one of an elongated rail and slot;
      a plurality of PSM electrical contacts on a corresponding one of the frame, the back, or a combination of the frame and back to mate with the PPM plurality of electrical contacts;

an electrical energy storage module (EESM), the EESM storing and discharging electrical energy and sized to fit substantially within the PSM elongated surface;

an input electrical energy interface (IEEI) configured to receive electrical energy from an external power source; and a control module sized to fit substantially within the PSM shell and communicate electrical energy between the plurality of electrical contacts, the EESM, and the IEEI.

2. The multicomponent apparatus of claim 1, wherein the control module includes a printed circuit board sized to substantially fit within the PSM shell.

3. The multicomponent apparatus of claim 1, wherein the respective rails have a shaped protrusion in cross section and the mating slots have a protrusion shaped relief in cross section.

4. The multicomponent apparatus of claim 1, wherein a respective rail has at least one of a protrusion and recess and a mating slot have at least one of a recess and protrusion located to engage the respective rail other of a protrusion and recess when the PPM is substantially seated within the PSM.

5. The multicomponent apparatus of claim 1, wherein the PHMD perimeter includes four sides and wherein the PPM includes a section sized and shaped to securely engage at least three of four sides of the PHMD perimeter.

6. The multicomponent apparatus of claim 5, wherein the PPM includes a molded extension module and the molded extension modules includes a perimeter sized and shaped to securely engage the four sides of the one of the plurality of PHMD perimeter.

7. The multicomponent apparatus of claim 6, wherein the molded extension module perimeter is at least partially deformable.

8. The multicomponent apparatus of claim 1, wherein the IEEI is a standardized electrical connector.

9. The multicomponent apparatus of claim 1, wherein the PPM further includes an EESM storing and discharging electrical energy and sized to fit substantially within the PPM back.

10. The multicomponent apparatus of claim 1, wherein the one of the PPM left and right combination and the top and bottom combination includes a connector and flexible cable deployable stored in one of the left and the right shoulder and the top and the bottom extension.

11. A multicomponent apparatus for providing power and device perimeter protection for a portable handheld mobile device (PHMD) apparatus including an electrical power coupling interface and an outer perimeter, the multicomponent apparatus including:

a perimeter protection module (PPM), the perimeter protection module including:

a frame including one of a left side and a right side and a top side and a bottom side forming an opening that when coupled to a PHMD engages at least 60% of the PHMD corresponding sides, the one of the left and right combination outer left side including one of an elongated rail and slot along at least a portion thereof and the outer right side including one of an elongated rail and slot along at least a portion thereof and the top and bottom combination outer top side including one of an elongated rail and slot along at least a portion thereof and the outer bottom side including one of an elongated rail and slot along at least a portion thereof; and a back coupled to the frame, the back including a corresponding inductive interface positioned to be operatively adjacent the PHMD inductive power interface; and a power source module (PSM), the power source module including:

a shell, the shell including an elongated surface with one of a corresponding combination of an elongated left shoulder and elongated right shoulder on opposite sides of the surface and a corresponding combination of an elongated top extension and elongated bottom extension on opposite sides of the surface, the one of the left and right combination inside surface of the left shoulder including the other of an elongated slot and rail sized to engage at least a portion of the PPM outer left side one of an elongated rail and slot and the inside surface of the right shoulder including the other of an elongated slot and rail sized to engage at least a portion of the PPM outer right side one of an elongated rail and slot and the top and bottom combination inside surface of the top extension including the other of an elongated slot and rail sized to engage at least a portion of the PPM outer top one of an elongated rail and slot and the inside surface of the bottom extension including the other of an elongated slot and rail sized to engage at least a portion of the PPM outer bottom one of an elongated rail and slot;

an electrical energy storage module (EESM), the EESM storing and discharging electrical energy and sized to fit substantially within the PSM shell;

an input electrical energy interface (IEEI) configured to receive electrical energy from an external power source;

an output electrical energy interface (OEEI) configured to provide electrical energy to the PHMD power coupling interface; and a control module sized to fit substantially within the PSM shell and communicate electrical energy between the OEEI, the EESM, and the IEEI.

12. The multicomponent apparatus of claim 11, wherein the control module includes a printed circuit board sized to substantially fit within the PSM shell.

13. The multicomponent apparatus of claim 11, wherein the respective rails have a shaped protrusion in cross section and the mating slots have a protrusion shaped relief in cross section.

14. The multicomponent apparatus of claim 11, wherein a respective rail has at least one of a protrusion and recess and a mating slot have at least one of a recess and protrusion located to engage the respective rail other of a protrusion and recess when the PPM is substantially seated within the PSM.

15. The multicomponent apparatus of claim 11, wherein the PHMD perimeter includes four sides and wherein the PPM includes a section sized and shaped to securely engage at least three of four sides of the PHMD perimeter.

16. The multicomponent apparatus of claim 15, wherein the PPM includes a molded extension module and the molded extension modules includes a perimeter sized and shaped to securely engage the four sides of the one of the plurality of PHMD perimeter.

17. The multicomponent apparatus of claim 16, wherein the molded extension module perimeter is at least partially deformable.

18. The multicomponent apparatus of claim 11, wherein the IEEI is a standardized electrical connector.

19. The multicomponent apparatus of claim 11, wherein the PPM further includes an EESM storing and discharging electrical energy and sized to fit substantially within the PPM back.

20. The multicomponent apparatus of claim 11, wherein the one of the PPM left and right combination and the top and bottom combination includes a connector and flexible cable deployable stored in one of the left and the right shoulder and the top and the bottom extension.

* * * * *